United States Patent [19]
Kobayashi

[11] Patent Number: 5,965,319
[45] Date of Patent: Oct. 12, 1999

[54] NEGATIVE TYPE IMAGE RECORDING MATERIAL

[75] Inventor: Fumikazu Kobayashi, Shizuoka, Japan

[73] Assignee: Fuji Photo Film Co., Ltd., Minami-Ashigara, Japan

[21] Appl. No.: 08/891,834

[22] Filed: Jul. 14, 1997

[30] Foreign Application Priority Data

Jul. 22, 1996 [JP] Japan ...................................... 8-192517

[51] Int. Cl.$^6$ ....................................................... G03C 1/52
[52] U.S. Cl. ........................ 430/176; 430/270.1; 430/914; 430/926
[58] Field of Search ..................................... 430/163, 176, 430/183, 914, 926, 919, 270.1

[56] References Cited

U.S. PATENT DOCUMENTS

| | | | |
|---|---|---|---|
| 5,340,699 | 8/1994 | Haley et al. | 430/302 |
| 5,536,616 | 7/1996 | Frechet et al. | 430/191 |
| 5,641,608 | 6/1997 | Grunwald et al. | 430/302 |
| 5,763,134 | 6/1998 | Busman et al. | 430/157 |

FOREIGN PATENT DOCUMENTS

| | | | |
|---|---|---|---|
| 632003 | 4/1995 | European Pat. Off. | C07C 39/15 |
| 7-20629 | 1/1995 | Japan . | |
| 7-271029 | 10/1995 | Japan . | |

*Primary Examiner*—Janet Baxter
*Assistant Examiner*—Rosemary Ashton
*Attorney, Agent, or Firm*—Burns, Doane, Swecker & Mathis, LLP

[57] ABSTRACT

A negative type image recording material comprising (A) an onium salt compound having sulfonic acid as the counter ion to generate sulfonic acid decomposed by light or heat, (B) a cross-linking agent cross-linkable by an acid such as a phenol derivative preferably having at least two hydroxymethyl or alkoxymethyl groups bonded to a benzene ring, (C) a polymer compound having an alkaline-soluble group such as a novolak resin, and (D) an infrared ray absorbing agent which is a dye or pigment to absorb an infrared ray having a wavelength of 720 to 1,200 nm. The negative type image recording material can allow direct production of a form plate from digital data, and provide excellent storability, a good latitude of heat treatment conditions after exposure, and excellent plate wear upon printing.

14 Claims, No Drawings

NEGATIVE TYPE IMAGE RECORDING MATERIAL

BACKGROUND OF THE INVENTION

1. Field of the Invention

The present invention relates to an image recording material which can be used as a planographic printing plate. More particularly, the present invention relates to a negative type image recording material suitably used as a planographic printing plate which is capable of directly producing a printing plate using an infrared laser based on digital signals output from a computer or the like.

2. Description of the Related Art

Conventionally, as systems for producing a form plate directly from digital computer data, there have been proposed (1) a system using an electrophotographic method; (2) a system using a photopolymerizable compound, which polymerizes by being exposed to a laser which emits blue or green light; (3) a system using a recording material in which a salt is laminated on a photosensitive resin; and (4) a system using a silver salt diffusion transfer method.

However, the system using an electrophotographic method (1) above has complicated image formation processes such as charging, exposure, developing, and the like and therefore the apparatus thereof becomes sophisticated and large. In a system using a photopolymerizable compound (2) above, since a form plate which is highly sensitive to blue or green light is used, it is difficult to handle in an illuminated room. In methods (3) and (4), since a silver salt is used, there are the disadvantages that processes such as developing and the like become complicated and the waste solution naturally contains silver.

In recent years, laser technologies have developed remarkably. In particular, high output and compact solid-state lasers and semiconductor lasers emitting infrared rays of a wavelength of 760 nm to 1,200 nm are readily available. These lasers are very useful as a light source for recording in the direct production of a form plate from digital computer data. However, since most practical useful photosensitive recording materials are sensitive to visible light having a wavelength of 760 nm or less, image recording cannot be carried out with these infrared lasers. Therefore, a material recordable with an infrared laser is desired.

Examples of such image recording materials capable of recording an image with an infrared ray laser include a recording material comprising an onium salt, a resol resin, a novolak resin, and an infrared ray absorbing agent disclosed in Japanese Patent Application Laid-Open (JP-A) No. 7-20629. Furthermore, Japanese Patent Application Laid-Open (JP-A) No. 7-271029 discloses a recording material comprising a s-triazine substituted with haloalkyl, a resol resin, a novolak resin, and an infrared ray absorbing agent. However, form plates formed with these image recording materials have problems such as stains which are formed in a nonimage portion when they are stored for a long period of time at a high temperature and high humidity, followed by image formation and printing. In addition, the sensitivity tends to fluctuate depending upon heat treatment conditions after exposure, resulting in deterioration of the durability to a level lower than that required for printing in a part of the plate surface due to unevenness of heat treatment in the exposure of a large image.

SUMMARY OF THE INVENTION

Accordingly, an object of the present invention is to provide a negative type image recording material usable as a negative type planographic printing plate, which is capable of directly producing a form plate from digital computer signals by using a solid-state laser or semiconductor laser emitting infrared rays, and which has excellent storability, good latitude in heat treatment conditions after exposure, and good printing durability.

The present inventor paid attention to the components of the negative type image recording materials and studied them extensively to determine that the above objects can be achieved by using a negative type image recording material comprising components (A) to (D) below, so that the present invention was completed.

That is, a negative type image recording material of the present invention comprises (A) an onium salt compound having sulfonic acid as the counter ion, (B) a cross-linking agent cross-linkable by an acid, (C) a polymer compound having an alkaline-soluble group, and (D) an infrared ray absorbing agent.

In a negative type image recording material of the present invention, energy applied by a solid-state laser or a semiconductor laser emitting an infrared ray is converted to thermal energy by (D) an infrared ray absorbing agent, (A) an onium salt compound having sulfonic acid as the counter ion is decomposed by heat to generate sulfonic acid, the generated sulfonic acid which is a strong acid group facilitates the cross-linking reaction between (B) a cross-linking agent cross-linkable by an acid and (C) a polymer compound having an alkaline-soluble group to record an image, that is, to produce a form plate.

DETAILED DESCRIPTION OF THE PREFERRED EMBODIMENTS

The present invention will be explained in detail with reference to components hereinafter.

(A) Onium Salt Compounds having Sulfonic Acid as the Counter Ion

Onium salts having sulfonic acid as the counter ion in the present invention include iodonium salt, sulfonium salt, diazonium salt and the like, which have sulfonic acid as the counter ion and which are decomposed by light or heat to generate sulfonic acid. These specific onium salts are compounds which are decomposed by the irradiation of a ray having a wavelength of 200 to 500 nm or by heating at 100° C. or more to generate sulfonic acid.

Examples of specific onium salt compounds preferably used in the present invention include the compounds represented by the following general formulas (I) to (III):

General formula (I)

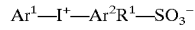

General formula (II)

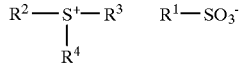

General formula (III)

In the above-mentioned general formulas, $R^1$ represents a hydrocarbon group having 20 or fewer carbon atoms which may be substituted.

Examples of hydrocarbon groups represented by $R^1$ include alkyl groups such as a methyl group, ethyl group, n-propyl group, isopropyl group, allyl group, n-butyl group, sec-butyl group, t-butyl group, hexyl group, cyclohexyl group, octyl group, 2-ethylhexyl group, and dodecyl group; alkenyl groups such as a vinyl group, 1-methylvinyl group, and 2-phenylvinyl group; aralkyl groups such as a benzyl group and phenethyl group; and aryl groups such as a phenyl group, tolyl group, xylyl group, cumenyl group, mesityl group, dodecylphenyl group, phenylphenyl group, naphthyl group, and anthracenyl group.

These hydrocarbon groups may have a substituent such as a halogen atom, hydroxy group, alkoxy group, aryloxy group, nitro group, cyano group, carbonyl group, carboxyl group, alkoxycarbonyl group, anilino group, and acetamido group. Examples of hydrocarbons having a substituent include trifluoromethyl group, 2-methoxyethyl group, 10-camphornyl group, fluorophenyl group, chlorophenyl group, bromophenyl group, iodophenyl group, methoxyphenyl group, hydroxyphenyl group, phenoxyphenyl group, nitrophenyl group, cyanophenyl group, carboxyphenyl group, methoxynaphthyl group, dimethoxyanthracenyl group, diethoxyanthracenyl group, and anthraquinonyl group.

$Ar^1$ and $Ar^2$ each represent an aryl group having 20 or fewer carbon atoms which may be substituted.

Examples of aryl groups represented by $Ar^1$ or $Ar^2$ include a phenyl group, tolyl group, xylyl group, cumenyl group, mesityl group, dodecylphenyl group, phenylphenyl group, naphthyl group, anthracenyl group, fluorophenyl group, chlorophenyl group, bromophenyl group, iodophenyl group, methoxyphenyl group, hydroxyphenyl group, phenoxyphenyl group, nitrophenyl group, cyanophenyl group, carboxyphenyl group, anilinophenyl group, anilinocarbonylphenyl group, morpholinophenyl group, phenylazophenyl group, methoxynaphthyl group, hydroxynaphthyl group, nitronaphthyl group, and anthraquinonyl group.

$R^2$, $R^3$, and $R^4$ each represent a hydrocarbon group having 18 or fewer carbon atoms which may be substituted.

Examples of hydrocarbon groups represented by $R^2$, $R^3$, and $R^4$ include hydrocarbon groups such as a methyl group, ethyl group, n-propyl group, isopropyl group, allyl group, n-butyl group, sec-butyl group, t-butyl group, hexyl group, cyclohexyl group, benzyl group, phenyl group, tolyl group, t-butylphenyl group, naphthyl group, and anthracenyl group; and hydrocarbons having a substituent group such as a 2-methoxyethyl group, fluorophenyl group, chlorophenyl group, bromophenyl group, iodophenyl group, methoxyphenyl group, hydroxyphenyl group, phenylthiophenyl group, hydroxynaphthyl group, methoxynaphthyl group, benzoylmethyl group, and naphthoylmethyl group.

$R^2$ and $R^3$ may be bonded each other to form a ring.

Examples of a cationic portion of the onium salts represented by the general formulas (I) to (III), include an iodonium ion, sulfonium ion, and diazonium ion. Examples of the structure of the cationic portions of these onium salts are shown below, but is not limited thereto.

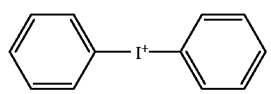
(I-a)

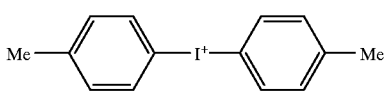
(I-b)

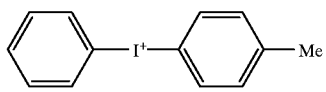
(I-c)

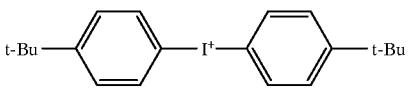
(I-d)

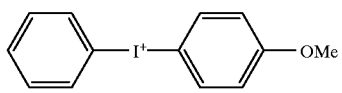
(I-e)

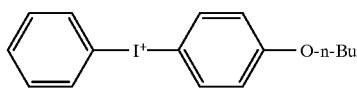
(I-f)

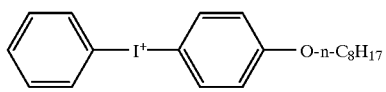
(I-g)

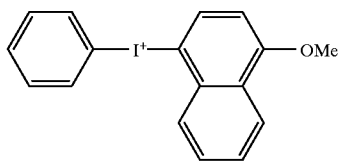
(I-h)

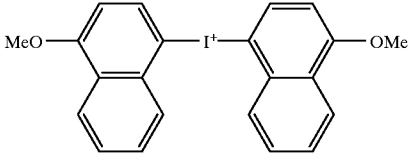
(I-i)

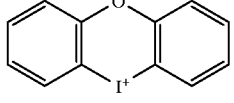
(I-j)

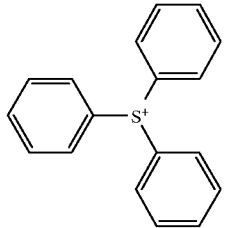
(II-a)

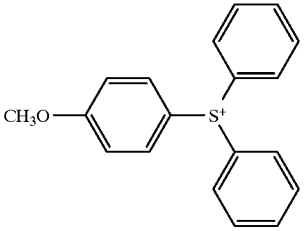
(II-b)

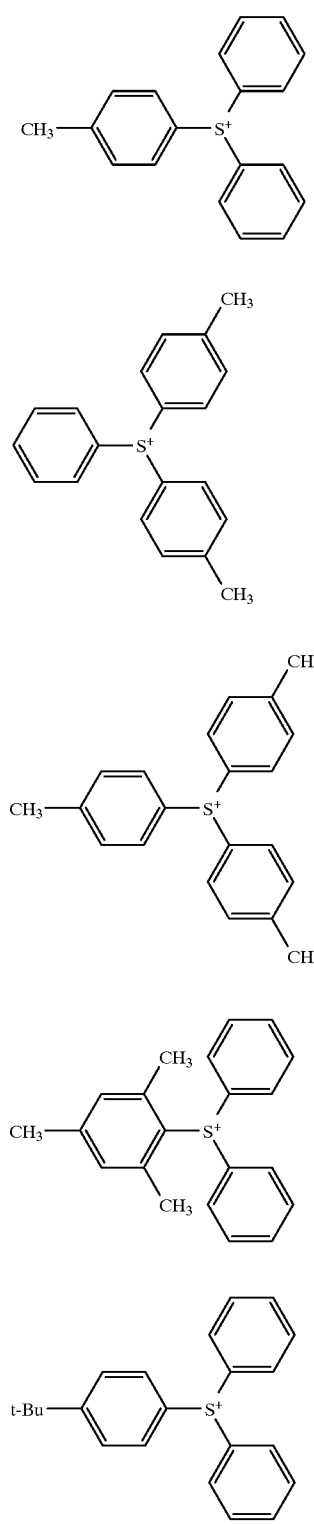
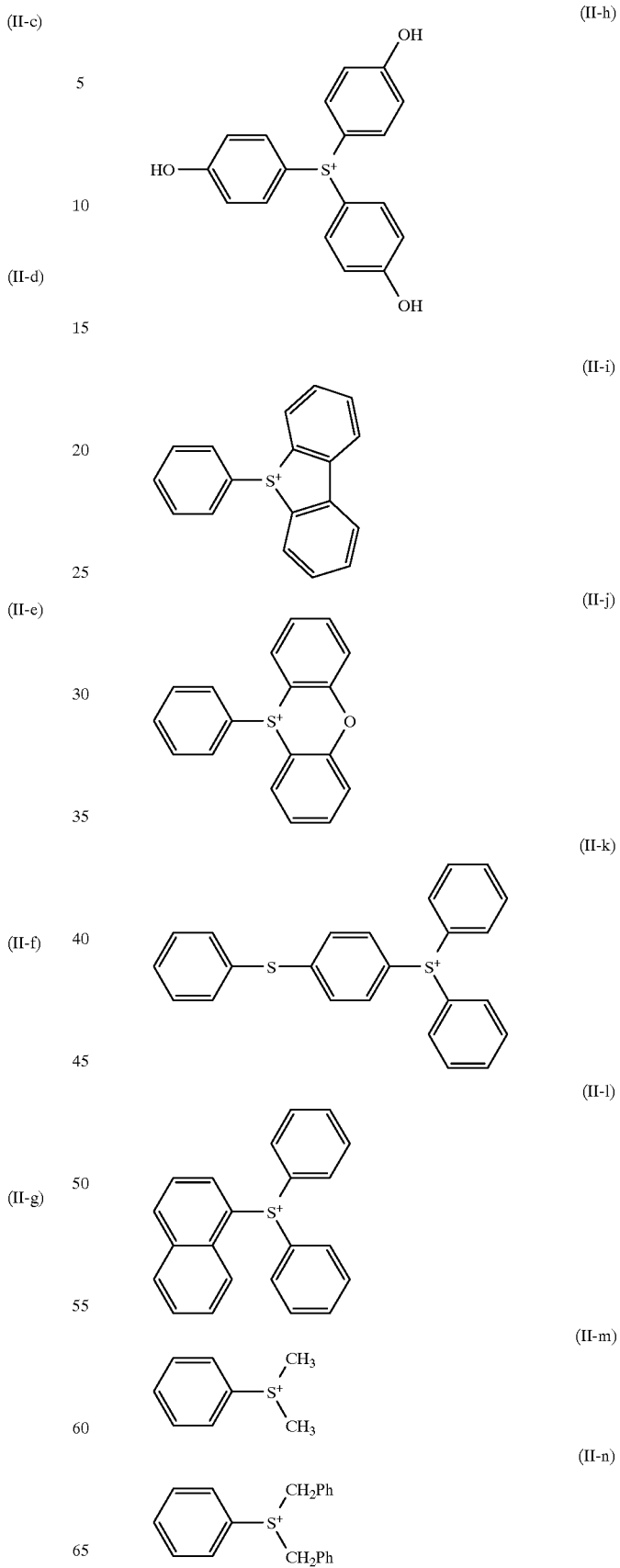

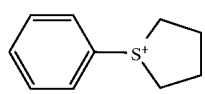 (II-o)
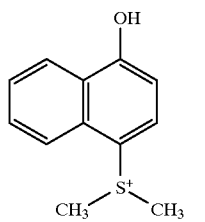 (II-p)
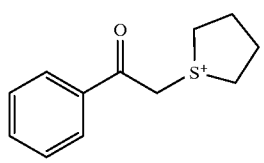 (II-q)
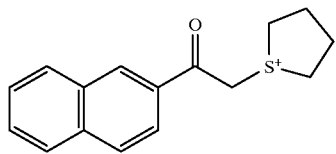 (II-r)
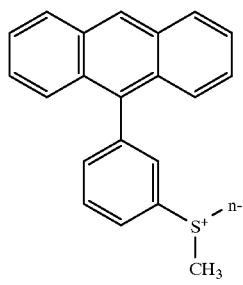 (II-s)
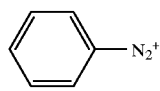 (III-a)
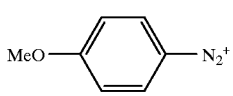 (III-b)
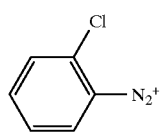 (III-c)
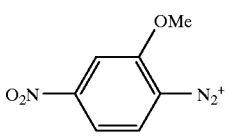 (III-d)
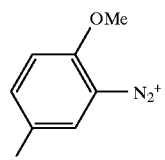 (III-e)
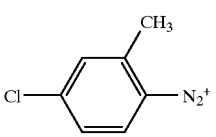 (III-f)
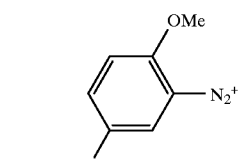 (III-g)
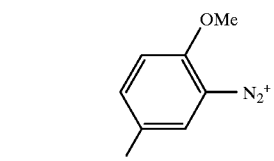 (III-h)
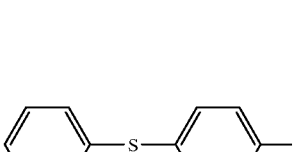 (III-j)
 (III-i)
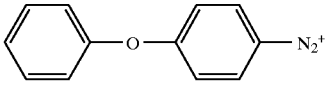 (III-j)
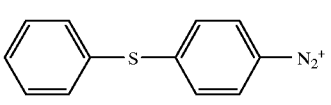 (III-k)
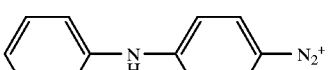 (III-l)
 (III-m)

(III-n) 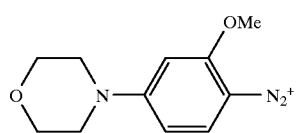

(III-o) 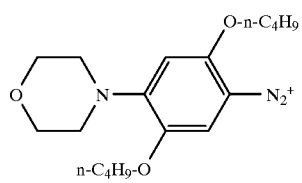

(III-p) 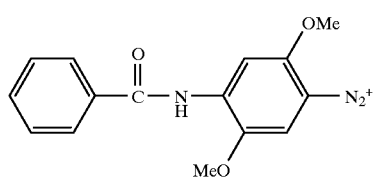

(III-q) 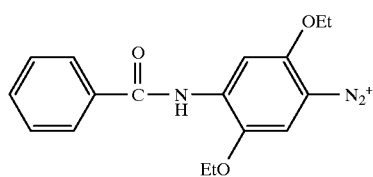

(III-r) 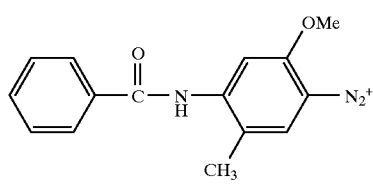

(III-s) 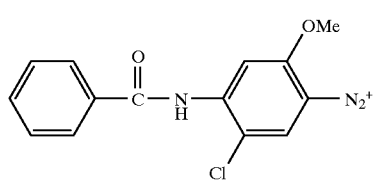

(III-t) 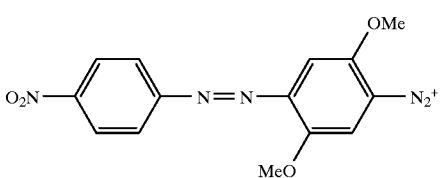

(III-u) 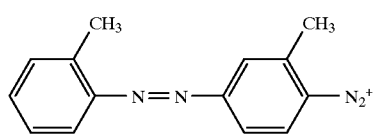

(III-v) 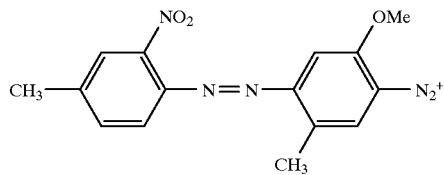

(III-w) 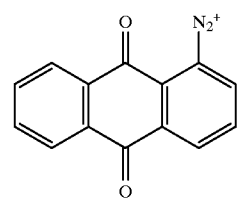

(III-w) 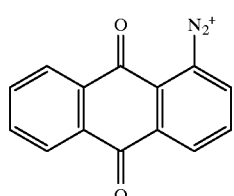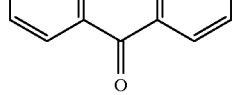

On the other hand, examples of sulfonate ions preferably used as the counter anion of these onium salts include:
1) methane sulfonate
2) ethane sulfonate
3) 1-propane sulfonate
4) 2-propane sulfonate
5) n-butane sulfonate
6) allyl sulfonate
7) 10-camphor sulfonate
8) trifluoromethane sulfonate
9) pentafluoroethane sulfonate
10) benzene sulfonate
11) p-toluene sulfonate
12) 3-methoxybenzene sulfonate
13) 4-methoxybenzene sulfonate
14) 4-hydroxybenzene sulfonate
15) 4-chlorobenzene sulfonate
16) 3-nitrobenzene sulfonate
17) 4-nitrobenzene sulfonate
18) 4-acetylbenzene sulfonate
19) pentafluorobenzene sulfonate
20) 4-dodecylbenzene sulfonate
21) mesitylene sulfonate
22) 2,4,6-triisopropyl benzene sulfonate
23) 2-hydroxy-4-methoxybenzophenone-5-sulfonate
24) dimethyl isophthalate-5-sulfonate
25) diphenyl amine-4-sulfonate
26) 1-naphthalene sulfonate
27) 2-naphthalene sulfonate
28) 2-naphthol-6-sulfonate
29) 2-naphthol-7-sulfonate
30) anthraquinone-1-sulfonate
31) anthraquinone-2-sulfonate
32) 9,10-dimethoxyanthracene-2-sulfonate
33) 9,10-diethoxyanthracene-2-sulfonate 34) quinoline-8-sulfonate
35) 8-hydroxyquinoline-5-sulfonate
36) 8-anilino-naththalene-1-sulfonate.

Salts of onium salt having 2 equivalent cations and disulfonates may also be used, such as:
41) m-benzene disulfonate
42) benzaldehyde-2,4-disulfonate
43) 1,5-naththalene disulfonate
44) 2,6-naphthalene disulfonate
45) 2,7-naphthalene disulfonate
46) anthraquinone-1,5-disulfonate
47) anthraquinone-1,8-disulfonate
48) anthraquinone-2,6-disulfonate
49) 9,10-dimethoxyanthracene-2,6-disulfonate
50) 9,10-diethoxyanthracene-2,6-disulfonate.

Onium salt sulfonates preferably used in the present invention can be obtained by salt exchange by mixing a corresponding Cl⁻ salt with sulfonic acid, sodium sulfonate or potassium sufonate in water or a solvent including water and a hydrophilic solvent such as alcohol.

An onium compound can be synthesized in a known method such as methods described in chapters 2 and 3 (p. 448) of vol. 14-I of "Maruzen Shin Jikken Kagaku Koza (Maruzen New Experimental Chemistry Lecture)"; chapters 8 and 16 (p. 1838) of vol. 14-III ibidem; chapters 7 and 14 (p. 1564) ibidem; vol. 91, 145 (1969) of J. Am. Chem. Soc. by J. W. Knapczyk et al.; vol. 35, 2532 (1970) of J. Org. Chem. by A. L. Maycok et al.; vol. 18, 2677 (1980) of Polym. Chem., Ed. by J. V. Crivello et al.; U.S. Pat. Nos. 2,807,648 and 4,247,473; Japanese Patent Application Laid-Open (JP-A) No. 53-101331; and Japanese Patent Application Publication (JP-B) No. 5-53166.

Examples of onium salt sulfonates preferably used in the present invention are shown below.

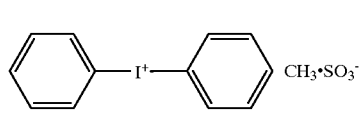

(I-a-1)

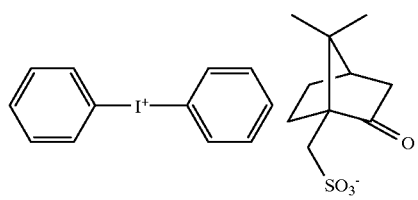

(I-a-7)

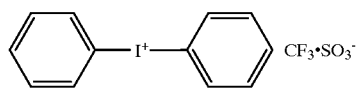

(I-a-8)

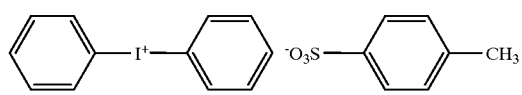

(I-a-11)

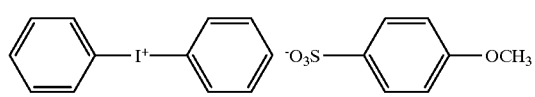

(I-a-13)

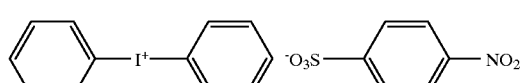

(I-a-17)

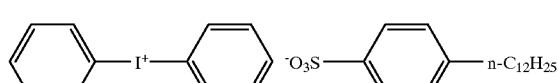

(I-a-20)

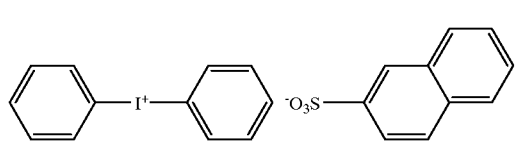

(I-a-27)

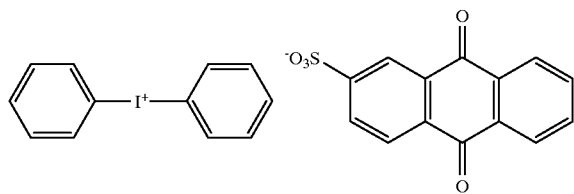
(I-a-31)
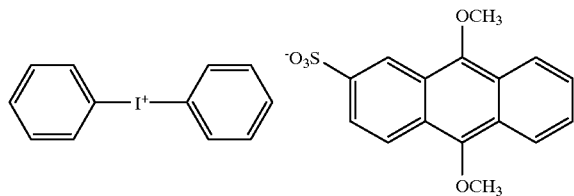
(I-a-32)
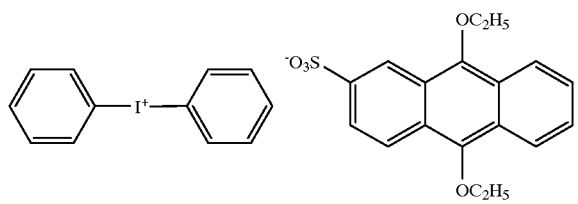
(I-a-33)
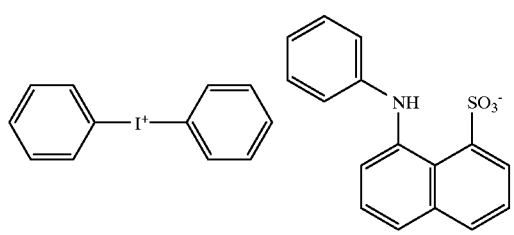
(I-a-36)
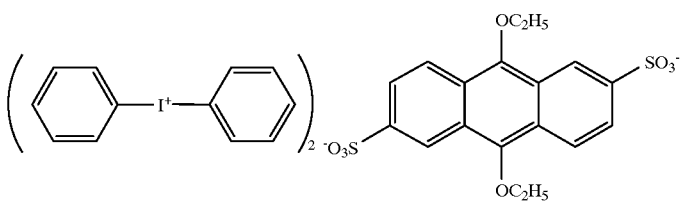
(I-a-50)
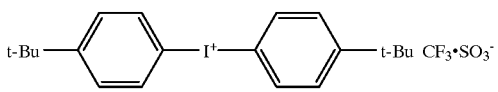
(I-d-8)
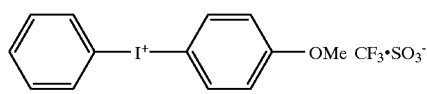
(I-e-8)
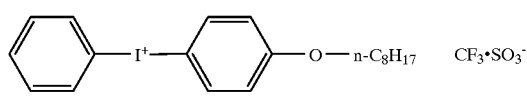
(I-g-8)
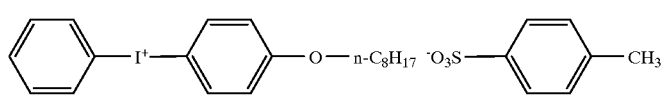
(I-g-11)

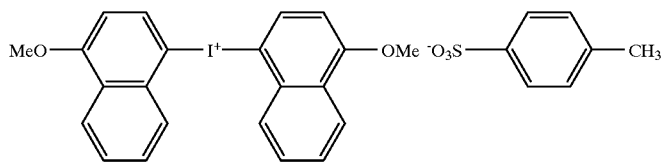
(I-i-11)
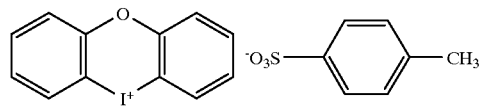
(I-j-11)
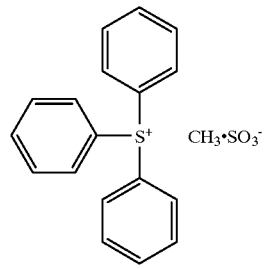
(II-a-1)
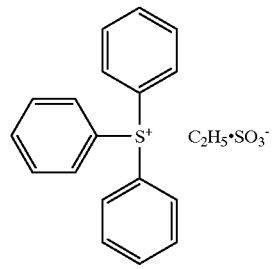
(II-a-2)
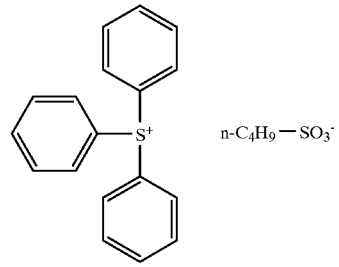
(II-a-5)
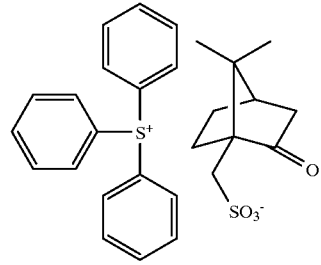
(II-a-7)

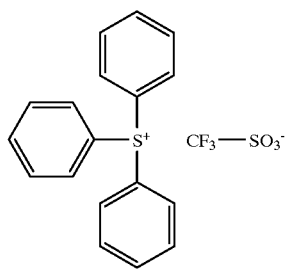
(II-a-8)
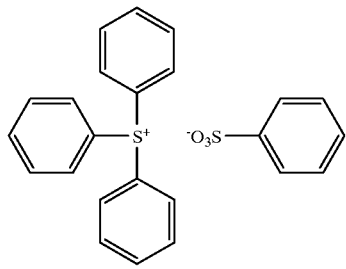
(II-a-10)
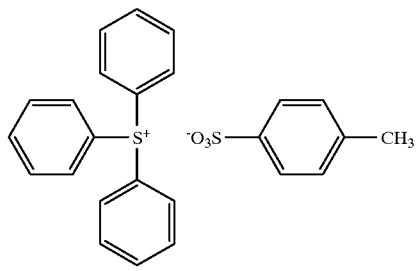
(II-a-11)
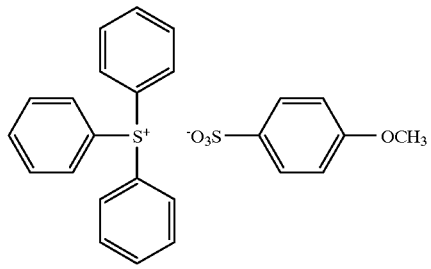
(II-a-13)
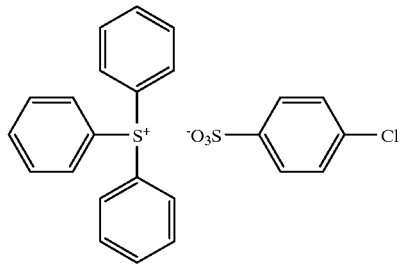
(II-a-15)

-continued
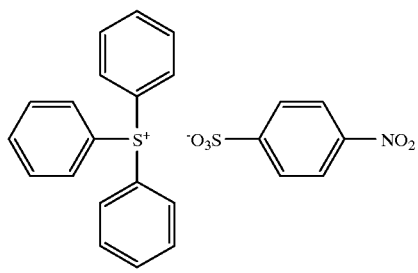
(II-a-17)
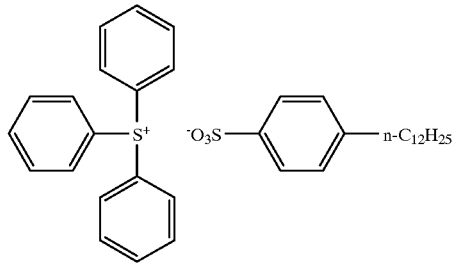
(II-a-20)
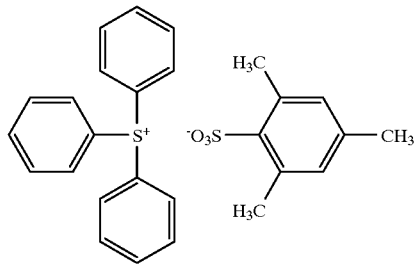
(II-a-21)
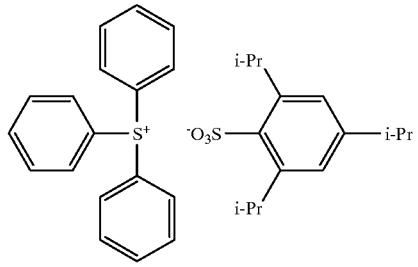
(II-a-22)
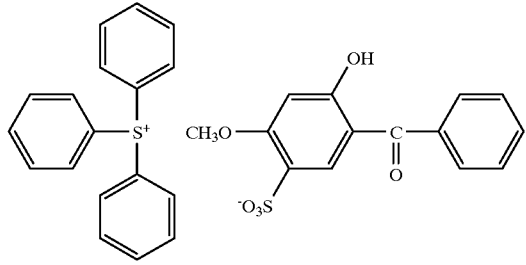
(II-a-23)

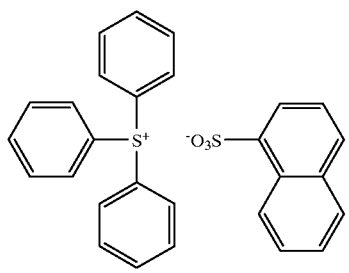
(II-a-26)
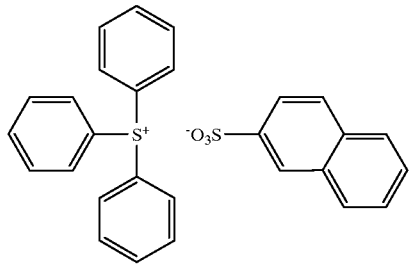
(II-a-27)
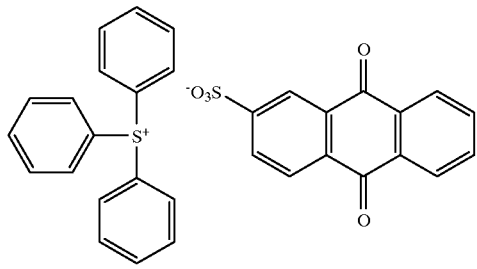
(II-a-31)
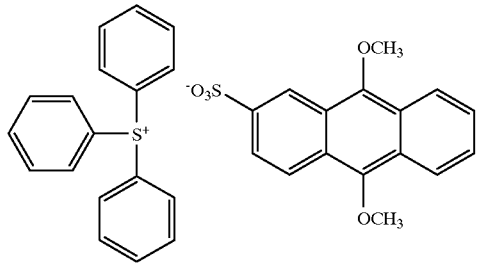
(II-a-32)
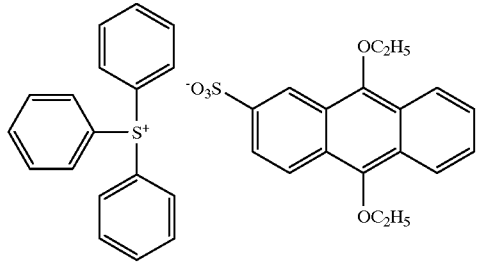
(II-a-33)

-continued
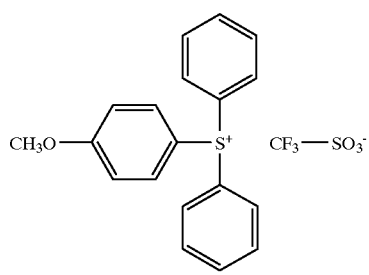
(II-b-8)
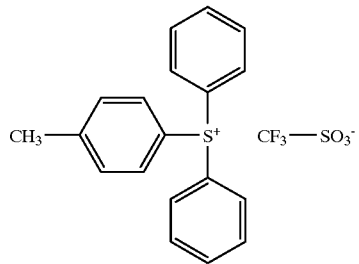
(II-c-8)
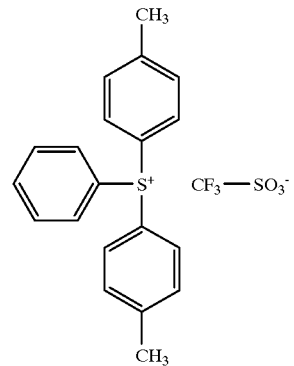
(II-d-8)
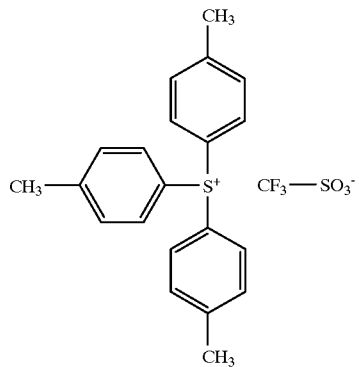
(II-e-8)
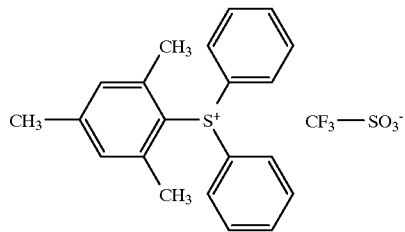
(II-f-8)

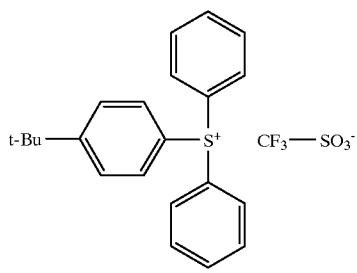
(II-g-8)
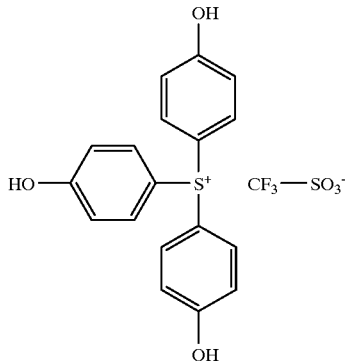
(II-h-8)
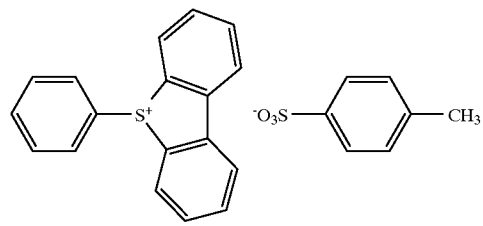
(II-j-11)
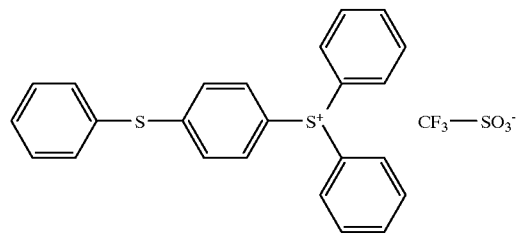
(II-k-8)
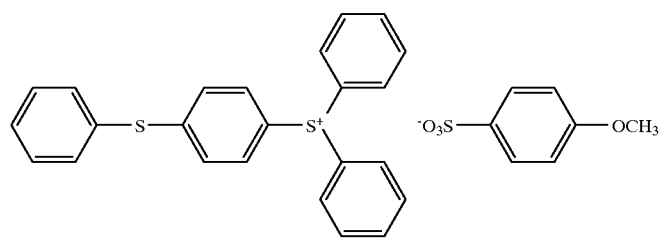
(II-k-13)
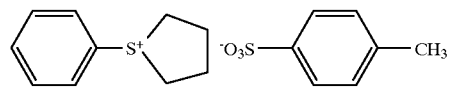
(II-o-11)

-continued
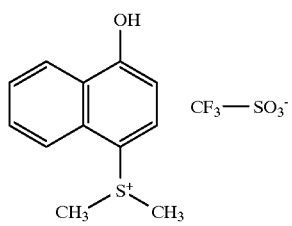
(II-p-8)
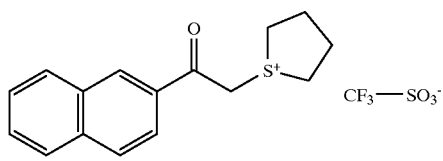
(II-r-8)
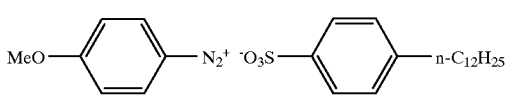
(III-b-20)
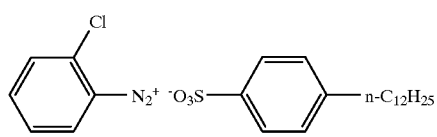
(III-c-20)
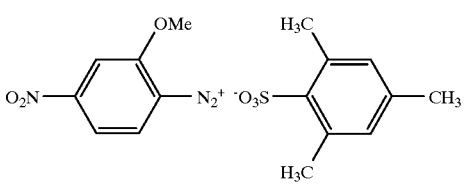
(III-d-21)
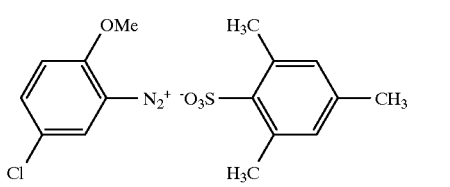
(III-e-21)
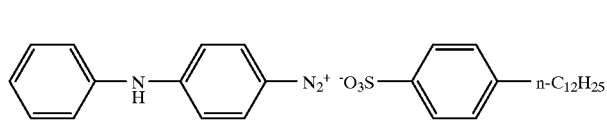
(III-k-20)
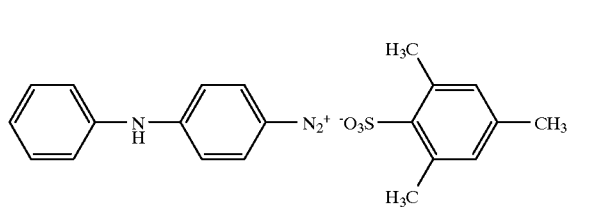
(III-k-21)
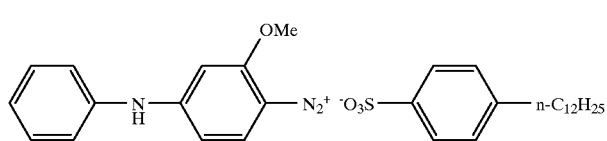
(III-l-21)

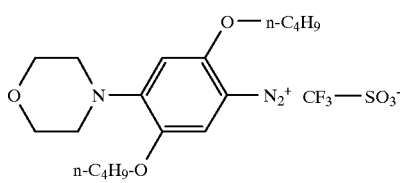
(III-o-8)

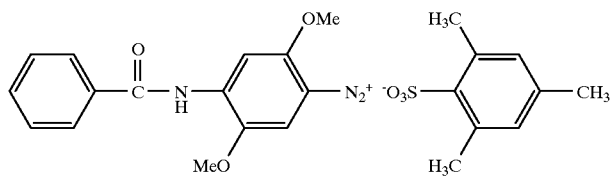
(III-p-21)

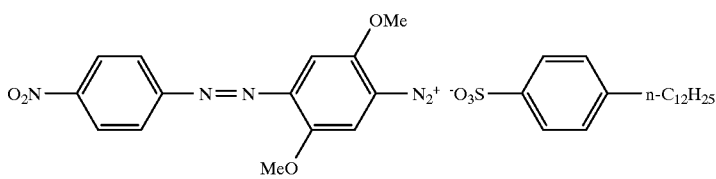
(III-t-20)

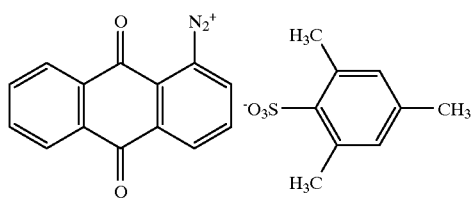
(III-w-21)

These compounds are added to an image recording material in an amount of 0.01 to 50% by weight, preferably 0.1 to 25% by weight, and more preferably 0.5 to 20% by weight based on the total solid component of the image recording material. In a case in which the amount added is less than 0.01% by weight, an image cannot be obtained, and, in a case in which the amount added is more than 50% by weight, a stain is produced in a nonimage formation portion at the time of printing, and thus neither is preferable.

(B) Cross-linking Agents Cross-linkable by an Acid

Cross-linking agents cross-linkable by an acid preferably used in the present invention (hereinafter referred to as a cross-linking agent) are compounds having, in a molecule, at least two groups bonded to a benzene ring, such as a hydroxymethyl group, alkoxymethyl group, epoxy group, and vinyl ether group. Examples thereof include methylol melamine, resol resin, epoxidized novolak resin, and urea resin. Furthermore, compounds disclosed in "Kakyozai Handbook (Cross-linking Agent Handbook)", by Shinzo Yamashita and Tosuke Kaneko, published by Taiseisha, Co., Ltd., are also preferable. In particular, phenol derivatives having, in a molecule, at least two groups bonded to a benzene ring such as a hydroxymethyl group and alkoxymethyl group provide good fastness in an image portion when an image is formed, and thus are preferable. Examples of phenol derivatives include resol resin.

However, these cross-linking agents are unstable with respect to heat, and thus they are not very favorable in terms of storability after the production of an image recording material. On the other hand, phenol derivatives having, in a molecule, at least two groups bonded to a benzene ring such as a hydroxymethyl group and alkoxymethyl group, and 3 to 5 benzene rings with a molecular weight of 1,200 or less have good storability, and thus are most preferably used in the present invention.

As an alkoxymethyl group, those having 6 or fewer carbon atoms are preferable. Examples thereof include a methoxymethyl group, ethoxymethyl group, n-propoxymethyl group, isopropoxymethyl group, n-butoxymethyl group, isobutoxymethyl group, sec-butoxymethyl group, and t-butoxymethyl group. Furthermore, alkoxy groups having an alkoxy substituent or alkoxy substituents such as a 2-methoxyethoxy group, and 2-methoxy-1-propyl group are also preferable.

Among these phenol derivatives, particularly preferable ones are shown below.

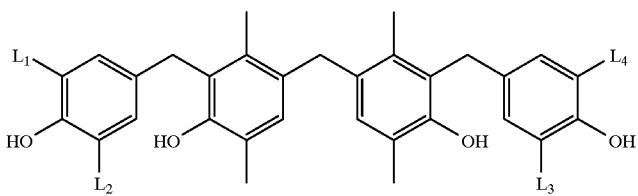
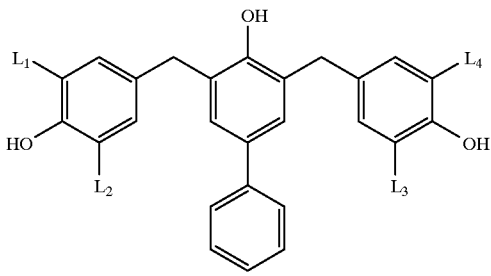
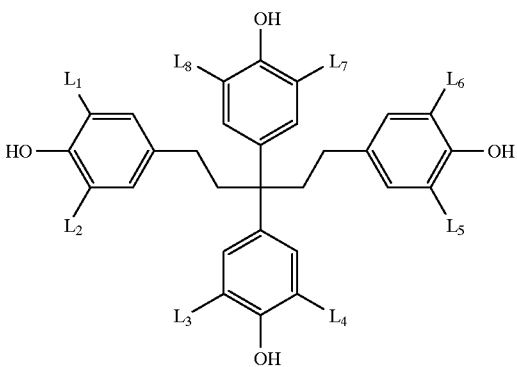
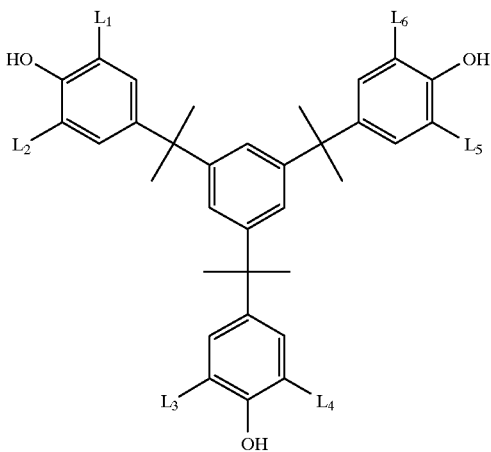
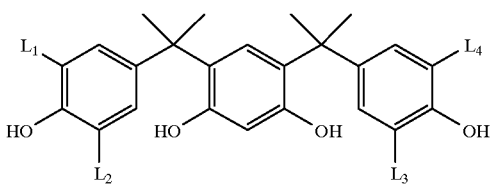
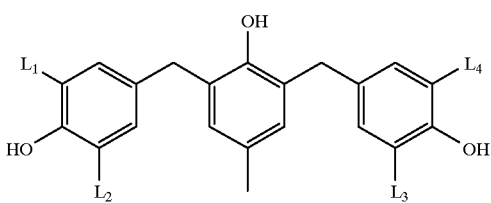

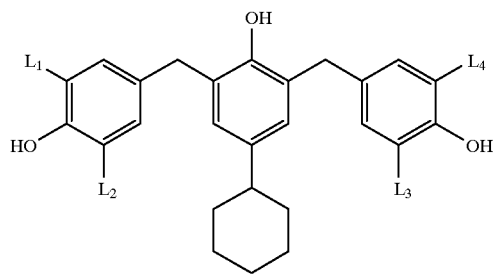
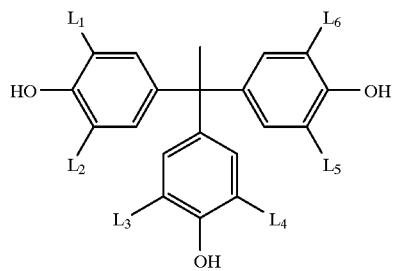
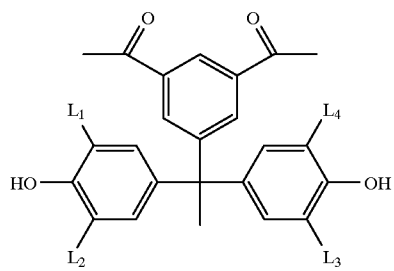
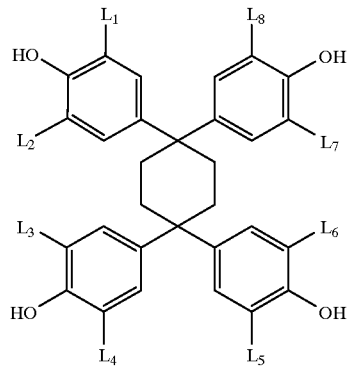
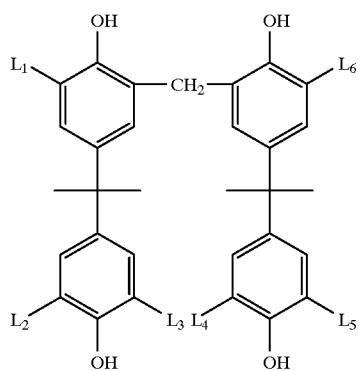

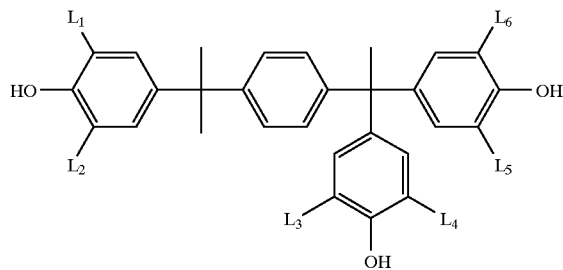
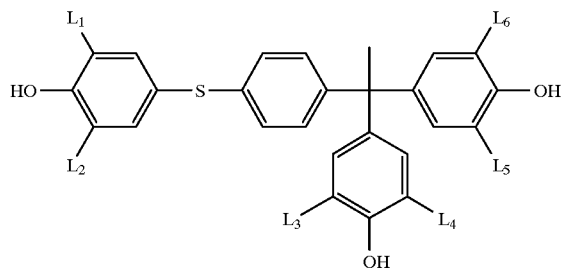
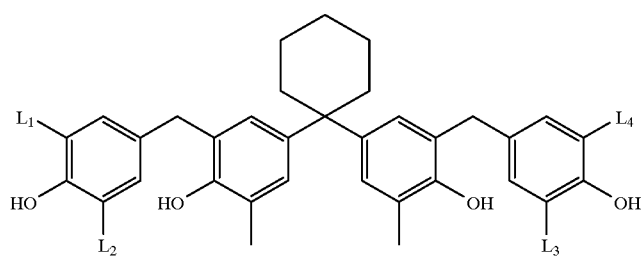
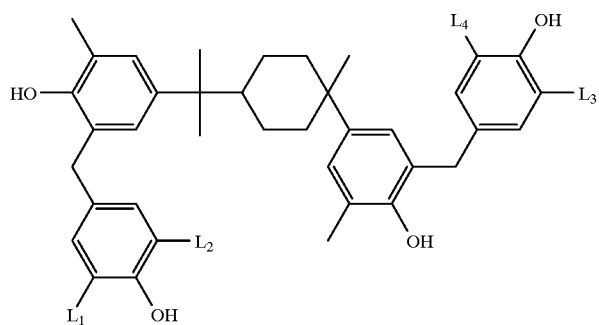
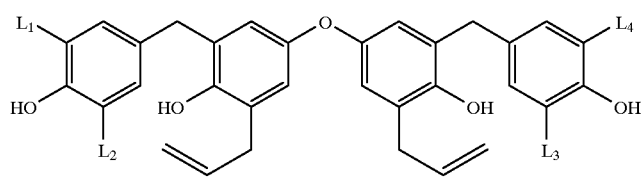
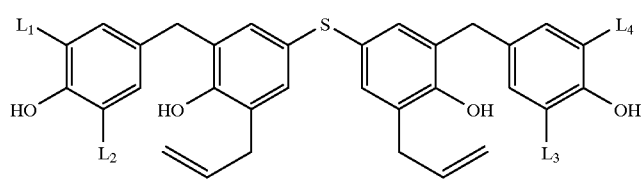
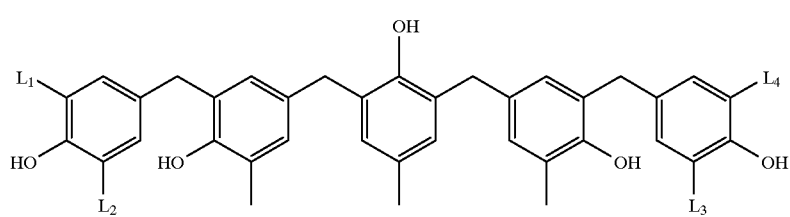

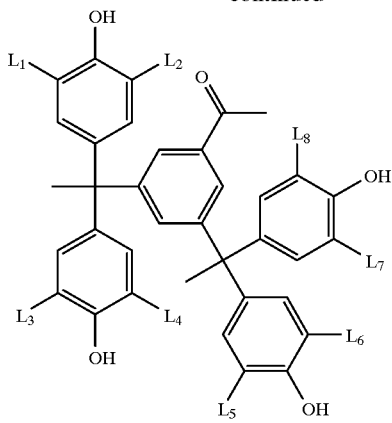

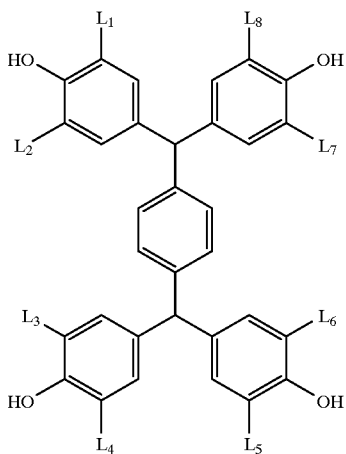

wherein $L^1$ to $L^8$ may be the same or different, and each represent a hydroxymethyl group, methoxymethyl group, or ethoxymethyl group.

Phenol derivatives having a hydroxymethyl group can be obtained by the reaction of a corresponding phenol compound without a hydroxymethyl group (a compound wherein $L^1$ to $L^8$ are hydrogen atoms in the above formulas) and formaldehyde in the presence of a base catalyst. At the time, it is preferable that a reaction temperature be 60° C. or less so as to prevent resinification or gelation of the phenol derivative. Specifically, the phenol derivatives having a hydroxymethyl group can be synthesized by methods disclosed in Japanese Patent Application Laid-Open (JP-A) Nos. 6-282067 and 7-64285.

Phenol derivatives having an alkoxymethyl group can be obtained by the reaction of a corresponding phenol derivative having a hydroxymethyl group and alcohol in the presence of an acid catalyst. At the time, it is preferable that a reaction temperature be 100° C. or less so as to prevent resinification or gelation of the phenol derivative. Specifically, the phenol derivatives having an alkoxymethyl can be synthesized by a method disclosed in European Patent (EP) No. 632,003A1.

The phenol derivatives having a hydroxymethyl group or an alkoxymethyl group synthesized as mentioned above are preferable in terms of storability. The phenol derivatives having an alkoxymethyl group are particularly preferably in terms of storability.

In the present invention, a cross-linking agent is used in the amount of 5 to 70% by weight, and preferably 10 to 65% by weight based on the total solid component of the image recording material. In a case in which the amount of the cross-linking agent is less than5% by weight, the film strength of the image portion at the time of image recording deteriorates. On the other hand, an amount more than 70% by weight is not preferable in terms of storability.

These cross-linking agents can be used alone or in a combination of two or more.

(C) Polymer Compounds having an Alkaline-soluble Group

Polymer compounds having an alkaline-soluble group used in the present invention (hereinafter referred to as alkaline-soluble polymer compound) mean resins having an alkaline-soluble group in a molecule, such as a novolak resin, acetone-pyrogallol resin, polyhydroxystyrenes, hydroxystyrene-N-substituted maleimide copolymer, hydroxystyrene-maleic anhydride copolymer, and polymer compound such as an acrylic copolymer or a urethane type polymer having an alkaline-soluble group, whose monomers include 1 mol % or more of a component unit having an acidic group such as an acrylic acid. Examples of an alkaline-soluble group here include a carboxyl group, phenolic hydroxyl group, sulfonic acid group, phosphonic acid group, and imide group.

Novolak resins are resins obtained by the condensation of phenols and aldehydes under an acidic condition. Examples of preferable novolak resins include novolak resin obtained from phenol and formaldehyde, novolak resin obtained from m-cresol and formaldehyde, novolak resin obtained from o-cresol and formaldehyde, novolak resin obtained from octylphenol and formaldehyde, novolak resin obtained from m-/p- mixed cresol and formaldehyde, novolak resin obtained from a mixture of phenol/cresol (either of m-, p-, o-, or m-/p-, m-/o-, o-/p- mixed) and formaldehyde, novolak resin obtained from resorcinol and formaldehyde, and novolak resin obtained from phenol/resorcinol and formaldehyde. It is preferable that these novolak resins have a weight-average molecular weight of 800 to 200,000 and a number-average molecular weight of 400 to 60,000.

In a case in which a polymer, at least one of whose monomers is hydroxystyrene such as poly-p-hydroxystyrene, poly-m-hydroxystyrene, p-hydroxystyrene-N-substituted maleimide copolymer, and p-hydroxystyrene-maleic anhydride copolymer is used, it is preferable that the weight-average molecular weight be 2,000 to 500,000, and preferably 4,000 to 300,000.

Examples of acrylic copolymers having an alkaline-soluble group include methacrylic acid-allylmethacrylate copolymer, methacrylic acid-benzylmethacrylate copolymer, methacrylic acid-hydroxyethylmethacrylate copolymer, poly(hydroxyphenyl methacrylamide), poly(hydroxyphenylcarbonyloxyethyl acrylate), and poly(2,4-dihydroxyphenyl carbonyloxyethyl acrylate). These acrylic resins are resins whose monomers include a component unit having, in a molecule, an acidic group such as carboxyl group and hydroxyphenyl group. Resins whose component units include 1 mol % or more of (meth)acrylic acid, hydroxystyrene, and hydroxyphenyl (meth)acrylamide based on the total component units and whose weight-average molecular weight is 2,000 to 500,000, preferably 4,000 to 300,000 is preferable.

Examples of urethane type polymers having an alkaline-soluble group include a resin obtained by the reaction of diphenylmethane diisocyanate, hexamethylene diisocyanate, tetraethylene glycol, and 2,2-bis (hydroxymethyl) propionic acid. It is preferable that theurethane typepolymerbea resin whose monomer include a component unit having an acidic group such as carboxylic acid and a hydroxyphenyl group in a molecule in an amount of 1 mol % or more.

Among these examples of alkaline soluble polymer compounds, novolak resins are preferable in terms of the durability of the form plate. On the other hand, polymers whose monomers include hydroxystyrene and acrylic copolymers having an alkaline-soluble group are preferable in terms of developing properties.

In the present invention, the amount of these alkaline soluble polymer compounds is 10 to 90% by weight, preferably 20 to 85% by weight, and more preferably 30 to 80% by weight based on the total solid component of the image recording material. If the amount of the alkaline soluble polymer compound is less than 10% by weight, the durability of the recording layer deteriorates. On the other hand, an amount more than 90% by weight is not preferable in terms of either sensitivity or durability.

These alkaline soluble polymer compounds can be used alone or in a combination of two or more.

(D) Infrared Ray Absorbing Agents

Infrared ray absorbing agents used in the present invention are a dye or pigment effectively absorbing an infrared ray having a wavelength of 760 nm to 1,200 nm. It is preferable that the dye or pigment have an absorption maximum between the wavelengths of 760 nm and 1,200 nm.

As dyes, known dyes commercially available or those disclosed in the literature (such as "Senryo Binran (Dye Handbook)" edited by Yuki Gosei Kagaku Kyokai (Organic Synthetic Chemistry Association), published in 1970, can be used. Specifically, examples include azo dyes, metal complex azo dyes, pyrazolone azo dyes, anthraquinone dyes, phthalocyanine dyes, carbonium dyes, quinoneimine dyes, methyne dyes, cyanine dyes, and metal thiolate complexes.

Examples of preferable dyes include cyanine dyes disclosed in Japanese Patent Application Laid-Open (JP-A) Nos. 58-125246, 59-84356, 59-202829, and 60-78787; methyne dyes disclosed in Japanese Patent Application Laid-Open (JP-A) Nos. 58-173696, 58-181690, and 58-194595; naphthoquinone dyes disclosed in Japanese Patent Application Laid-Open (JP-A) Nos. 58-112793, 58-224793, 59-48187, 59-73996, 60-52940, and 60-63744; squalilium dyes disclosed in Japanese Patent Application Laid-Open (JP-A) No. 58-112792; and cyanine dyes disclosed in U.K. Patent No. 434,875.

Furthermore, near infrared absorption sensitizing agents disclosed in U.S. Pat. No. 5,156,938 can be preferably used. Moreover, substituted aryl benzo(thio)pyrylium salts disclosed in U.S. Pat. No. 3,881,924; trimethyne thiapyrylium salts disclosed in Japanese Patent Application Laid-Open (JP-A) No. 57-142645 (U.S. Pat. No. 4,327,169); pyrylium-containing compounds disclosed in Japanese Patent Application Laid-Open (JP-A) Nos. 58-181051, 58-220143, 59-41363, 59-84248, 59-84249, 59-146063, and 146061; cyanine dyes disclosed in Japanese Patent Application Laid-Open (JP-A) No. 59-216146; pentamethyne thiopyrylium salts disclosed in U.S. Pat. No. 4,283,475; and pyrylium compounds disclosed in Japanese Patent Application Publication Nos. 5-13514 and 5-19702 can be preferably used as well.

As other examples of preferable dyes, near infrared absorption dyes disclosed U.S. Pat. No. 4,756,993 represented by formulas (I) and (II) can be presented.

Among these dyes, particularly preferable are cyanine dyes, squalilium dyes, pyrylium salts, and nickel thiolate complexes.

Pigments usable in the present invention include commercially available pigments and those disclosed in the Color Index (C. I.) Manual, "Saishin Ganryo Binran (Modern Pigment Manual)" edited by Nippon Ganryo Gijutsu Kyokai (Japan Pigment Technology Association), published in 1977; "Ganryo Oyo Gijutsu (Modern Pigment Application Technology)" by CMC Press, published in 1986; and "Insatsu Ink Gijutsu (Printing Ink Technology)" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigment, phthalocyanine pigments, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Among these examples, carbon black is preferable.

These pigments can be used without surface treatment, or can be used after being applied with surface treatment. Examples of surface treatment methods include a method of surface coating with a resin or a wax, a method of adhering a surfactant, and a method of bonding a reactive substance (such as a silane coupling agent, an epoxy compound, and polyisocyanate) with the pigment surface. The abovementioned surface treatment methods are disclosed in "Kinzokusekken no Seishitsu to Oyo (Natures and Applications of Metal Soaps)" by Sachi Press; "Insatsu Ink Gijutsu (Printing Ink Technology)" by CMC Press; published in 1984; and "Saishin Ganryo Oyo Gijutsu (Modern Pigment Application Technology)" by CMC Press, published in 1986.

A pigment particle size of 0.01 µm to 10 µm is preferable, 0.05 µm to 1 µm is more preferable, and 0.1 µm to 1 µm is the most preferable. A pigment particle size smaller than 0.01 µm is not preferable in terms of the stability of the pigment dispersion in a photosensitive layer coating solution. On the other hand, a pigment particle size larger than 10 µm is not preferable in terms of the uniformity of the image recording layer.

As methods of dispersing a pigment, known dispersing methods employed in ink production or toner production can be used. Examples of dispersing machines include ultrasonic dispersing machines, sand mills, attritors, pearl mills, super mills, ball mills, impellers, dispersers, KD mills, colloid mills, dynatrons, triple roll mills, and pressure kneaders. Details thereof are described in "Saishin Ganryo Oyo Gijutsu (Modern Pigment Application Technology)" by CMC Press, published in 1986.

These dyes or pigments can be added in an amount of 0.01 to 50% by weight based on the total solid component of the image recording material, preferably in an amount of 0.1 to 10% by weight, more preferably in an amount of 0.5 to 10% by weight in the case of a dye, and more preferably in an amount of 3.1 to 10% by weight in the case of apigment. An amount of a pigment or dye less than 0.01% by weight causes low sensitivity. On the other hand, an amount more than 50% by weight produces stains in a nonimage portion at the time of printing.

These dyes or pigments can be added in a layer with other components or, in a case in which the image recording material comprises a plurality of layers, can be added in a layer which is different from a layer containing the other components.

Other Components

In the present invention, the above-mentioned four components (A) to (D) are necessary, and various compounds can be added to the image recording material as needed.

For example, a dye having a large absorption in the visible light region can be used as the coloring agent.

Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes disclosed in Japanese Patent Application Laid-Open (JP-A) No. 62-293247.

It is preferable to add these dyes for easily distinguishing the image portion and the nonimage portion after image formation. The amount to be added is 0.01 to 10% by weight based on the total solid component of the image recording material.

In order to enable stable treatment regardless of the fluctuation in development conditions, a nonionic surfactant disclosed in Japanese Patent Application Laid-Open (JP-A) Nos. 62-251740 and 3-208514 and an ampholytic surfactant disclosed in Japanese Patent Application Laid-Open (JP-A) Nos. 59-121044 and 4-13149 can be added to an image recording material of the present invention.

Examples of nonionic surfactants include sorbitan tristearate, sorbitan monopalmitate, sorbitan triolate, mono glyceride stearate, and polyoxyethylene nonylphenyl ether.

Examples of ampholytic surfactants include alkyl di(aminoethyl)glycine, alkyl polyaminoethylglycine hydrochloride, 2-alkyl-n-carboxyethyl-N-hydroxyethyl imidazolinium betaine, and N-tetradecyl-N,N-substituted betaine (for example, Amorgen K manufactured by Dai-Ichi Kogyo Co., Ltd.).

The amount of the above-mentioned nonionic surfactants and ampholytic surfactants is preferably 0.05 to 15% by weight, and more preferably 0.1 to 5% by weight in an image recording material.

In order to provide flexibility to the film, etc., a plasticizer can be added as needed to the image recording material of the present invention. Examples of a plasticizer include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer and a polymer of acrylic acid or methacrylic acid.

In addition to these examples, the above-mentioned onium salts, haloalkylated s-triazines, epoxy compounds, vinyl ethers, phenol compounds having an alkoxy methyl group and phenol compounds having a hydroxymethyl group disclosed in Japanese Patent Application No. 7-18120, can also be added.

An image recording material of the present invention can be produced, in general, by dissolving the above-mentioned component in a solvent and applying the resultant solution to an appropriate support. Solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrolidone, dimethyl sulfoxide, sulfolane, γ-butyl lactone, toluene, and water.

These solvents are used alone or as a mixture. The concentration of the above-mentioned components (total solid components including additives) is preferably 1 to 50% by weight in the solution. The application amount (solid component) on the support obtained after applying and drying is determined according to the application purpose. However, as to the planographic printing plate, in general, 0.5 to 5.0 g/m$^2$ is preferable. As a method of application, various methods can be used, such as bar coater application, rotation application, spray application, curtain application, dip application, air knife application, blade application, and roll application. As the application amount decreases, the apparent sensitivity increases, but the film characteristic of the image recording film decreases.

A surfactant for improving the applicability, such as a fluorine-containing surfactant disclosed in Japanese Patent Application Laid-Open (JP-A) No. 62-170950 can be added to an image recording layer of the present invention. An addition amount is preferably 0.01 to 1% by weight based on the total solid component of the image recording material, and more preferably 0.05 to 0.5% by weight.

Examples of a support used in the present invention include dimensionally stable plate-like substances such as paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic film laminated or deposited with the above-mentioned metals.

A polyester film or an aluminum plate is preferable as a support in the present invention. In particular, an aluminum plate is preferable since it has good dimensional stability and can be provided at a relatively low cost. Examples of preferable aluminum plates include pure aluminum plates and alloy plates comprising aluminum as the main component and trace quantities of a different element. Furthermore, plastic films to which aluminum is laminated or deposited can also be used. Examples of different elements included in an aluminum alloy include silicon, iron, manganese, copper, magnesium, chrome, zinc, bismuth, nickel, and titanium. An amount of the different element in the alloy is preferably 10% by weight or less. In the present invention, pure aluminum is particularly preferable. However, since production of a completely pure aluminum is difficult in terms of refining technology, one containing trace quantities of a different element can be used. The composition of an aluminum plate applied in the present invention as mentioned above is not specifically defined, and a known aluminum plate can be also used. The thickness of an aluminum plate used in the present invention is about 0.1 mm to 0.6 mm, preferably 0.15 mm to 0.4 mm, and more preferably 0.2 mm to 0.3 mm.

In a case in which an aluminum plate is used as the support, in order to improve the adherence of the support and a layer formed thereon, it is preferable to roughen the aluminum plate surface. Prior to roughening of the aluminum plate, a degreasing treatment with a surfactant, an organic solvent, or an aqueous alkaline solution is conducted for removing the rolling oil on the surface as needed.

The surface roughening treatment of an aluminum plate can be implemented using various methods, such as a mechanically roughening method, an electrochemically roughening method in which a plate surface is dissolved, and a chemically roughening method in which a plate surface is dissolved selectively. As a mechanical method, known methods such as a ball abrasion method, brush abrasion method, blast abrasion method, and buff abrasion method can be used. As an electrochemically roughening method, a method in which an alternating current or direct current is applied to a plate in an electrolytic solution containing a hydrochloric acid or nitric acid can be used. Further, a method combining both of the above-mentioned methods as disclosed in Japanese Patent Application Laid-Open (JP-A) No. 54-63902 can be used.

An aluminum plate to which surface roughening treatment is applied may be subjected to an alkaline etching treatment or a neutralizing treatment, if necessary, followed by an anodizing treatment so as to improve the water retention property and the abrasion resistance property of the surface, if desired. As an electrolyte used in the anodizing treatment of an aluminum plate, various electrolytes which form a porous oxide film can be used. In general, sulfuric acid, phosphoric acid, oxalic acid, chromic acid, or a mixture thereof can be used. The concentration of an electrolyte is suitably decided according to the type of electrolyte.

Conditions of anodizing are determined according to the type of electrolyte to be used, and thus cannot be specified as a whole. However, in general, conditions of an electrolyte solution concentration of 1 to 80% by weight, a solution temperature of 5 to 70° C., a current density of 5 to 60 A/dm$^2$, a voltage of 1 to 100 V, and an electrolysis duration of 10 seconds to 5 minutes are appropriate.

An amount of anodized film less than 1.0 g/m$^2$ causes insufficient plate wear, and scratches are easily produced in a nonimage portion of the planographic printing plate and, thereby, so-called "scratch toning" which occurs by inking the scratches is easily produced.

After the anodizing treatment, hydrophilic treatment is applied to the aluminum surface, if necessary. Examples of a hydrophilic treatment used in the present invention include an alkaline metal silicate (such as an aqueous solution of sodium silicate) method as disclosed in U.S. Pat. Nos. 2,714,066, 3,181,461, 3,280,734, and 3,902,734. In this method, the support is treated by immersing or electrolysis with an aqueous solution of sodium silicate. Other examples include a method of treating with potassium fluorozirconate disclosed in Japanese Patent Application Publication (JP-B) No. 36-22063 and a method of treating with polyvinyl phosphonate disclosed in U.S. Pat. Nos. 3,276,868, No. 4,153,461, and 4,689,272.

An image recording material of the present invention can comprise a primer layer on the support, if necessary.

Various organic compounds can be used as a primer layer component. Examples include carboxy methyl cellulose; dextrin; gum arabic; organic phosphonic acids which may be substituted, such as phosphoric acids having an amino group (for example, 2-amino ethyl phosphonic acid), phenyl phosphonic acid, naphthyl phosphonic acid, alkyl phosphonic acid, glycero phosphonic acid, methylene diphosphonic acid, and ethylene diphosphonic acid; organic phosphoric acids which may be substituted, such as phenyl phosphoric acid, naphthyl phosphoric acid, alkyl phosphoric acid, and glycero phosphoric acid; organic phosphinic acids which may be substituted, such as phenyl phosphinic acid, naphthyl phosphinic acid, alkyl phosphinic acid, and glycero phosphinic acid; amino acids such as glycine and β-alanine; and hydrochlorides of amine having a hydroxy group, such as hydrochloride of triethanol amine. A primer layer component can be selected therefrom, and can be used in a combination of two or more.

An appropriate amount of an organic primer layer is 2 to 200 mg/m$^2$.

As heretofore mentioned, a planographic printing plate using an image recording material of the present invention can be produced. The planographic printing plate is exposed imagewise to an infrared ray having a wavelength of 760 nm to 1,200 nm emitted from a solid-state laser or a semiconductor laser. In the present invention, the printing plate can be developed immediately after the laser irradiation, but is preferably treated with heat between the laser irradiation process and the developing process. Preferable temperature and time of a heat treatment are a range of 80° C. to 150° C. and a duration of 10 seconds to 5 minutes, respectively. The laser energy necessary for recording due to laser irradiation can be reduced by the heat treatment.

Subsequently, the image recording material of the present invention is developed by an aqueous alkaline solution.

A conventionally known aqueous alkaline solution can be used as a developer or a replenisher for an image recording material of the present invention. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Furthermore, also used are organic alkaline agents such as monomethyl amine, dimethyl amine, trimethyl amine, monoethyl amine, diethyl amine, triethyl amine, monoisopropyl amine, diisopropyl amine, triisopropyl amine, n-butyl amine, monoethanol amine, diethanol amine, triethanol amine, monoisopropanol amine, diisopropanol amine, ethylene imine, ethylene diamine, and pyridine.

These alkaline agents can be used alone or in a combination of two or more.

Particularly preferable developers among these alkaline agents are an aqueous solution of silicate, such as sodium silicate, and potassium silicate. These are preferable because the developing property can be adjusted by the ratio and concentration of silicon dioxide $SiO_2$ which is a component of silicate and an alkaline metal oxide $M_2O$. For example, alkaline metal silicates disclosed in Japanese Patent Application Laid-Open (JP-A) No. 54-62004 and Japanese Patent Application Publication (JP-B) No. 57-7427 can be used effectively.

Furthermore, it is known that, in a case in which an automatic developing machine is used for developing, by adding to the developer an aqueous solution (replenisher) whose alkaline is stronger than that of the developer, a large amount of planographic printing plates can be developed without changing the developer in the developing tank for a long time. The replenishing method is also preferably applied in the present invention.

Various types of surfactants and organic solvents can be added to a developer or a replenisher for promoting or curbing the developing property, improving the dispersion of developing scum or comformity of the printing plate image portion to ink as needed. Examples of preferable surfactants include anionic surfactants, cationic surfactants, nonionic surfactants, and ampholytic surfactants.

Furthermore, reducing agents such as a sodium salt or a potassium salt of an inorganic acid including hydroquinone, resorcin, sulfurous acid, and hydrogen sulfurous acid, organic carboxylic acid, antifoaming agents, and water softeners can be added to a developer or a replenisher as needed.

Printing plates developed with the above-mentioned developers and replenishers are subjected to a posttreatment with a rinsing solution containing water, a surfactant, etc., and a desensitizing solution containing gum arabic, a starch derivative, etc. As aposttreatment employed in a case in which an image recording material of the present invention is used as the printing plate, these treatments can be used in combination.

Recently, an automatic developing machine has been widely used in plate making and printing industries in order to streamline and standardize the plate making operation. In general, this automatic developing machine comprises a developing part and a posttreatment part, and each part comprises a device for conveying a printing plate, treatment tanks, and spraying devices, wherein the developing processing is carried out by spraying a treatment, which is pumped up by a pump, from a spray nozzle to the printing plate after exposure, while the printing plate is being conveyed horizontally. In addition, a processing method has also become known recently in which an exposed printing plate is immersed in a treatment tank filled with the treatment while the printing plate is being conveyed by guide rollers. In such automatic processing, a replenisher can be replenished for each treatment depending upon the amount of printing plate to be developed, work time, and the like.

A planographic printing plate obtained as mentioned above can be provided for a printing process, after applying a desensitizing gum, if desired. However, in a case in which a planographic printing plate having higher plate wear is desired, a burning treatment is applied to it.

In a case in which a burning treatment is applied to a planographic printing plate, it is preferable to treat the plate with a counteretching solution, as disclosed in Japanese Patent Application Publication (JP-B) Nos. 61-2518 and 55-28062, and Japanese Patent Application Laid-Open (JP-A) Nos. 62-31859, and 61-159655, before burning.

Methods thereof include a method of applying the counteretching solution on a planographic printing plate with a sponge or an absorbent cotton impregnated with them, a method of applying the counteretching solution to a printing plate by immersion the plate in a tray filled with the solution, and a method of applying the solution to the plate by an automatic coater. By equalizing an amount of the solution with a squeegee or a squeegee roller after the application, a further preferable result can be obtained.

An appropriate amount of a counteretching solution to be applied is of 0.03 to 0.8 $g/m^2$ (dry weight), in general.

A planographic printing plate to which the counteretching solution is applied and which is dried is heated at a high temperature with a burning processor (such as a burning processor BP-1300 commercially available from Fuji Photo Film co., Ltd.) as needed. The heating temperature and the duration depend on the type of components forming the image. However, a range of 180 to 300° C. and a range of 1 to 20 minutes are preferable.

A planographic printing plate treated with the burning treatment can be subjected to conventional treatments such as washing with water and gum coating as needed. However, in a case in which a counteretching solution containing a water-soluble polymer compound is used, a desensitizing treatment such as gum coating can be omitted.

A planographic printing plate obtained by such treatment is used in an offset printer for printing large quantities.

EXAMPLES

Hereinafter, the present invention will be explained in further detail with reference to examples, but, the present invention is not limited thereto.

(A) Synthesis of Sulfonic Acid Generators

Synthesis of Compound (I-a-32)

A solution obtained by dissolving 17.3 g of diphenyl iodonium chloride (manufactured by Aldrich Corp.) in a solvent mixture of 350 ml of water and 350 ml of methanol, and a solution obtained by dissolving 20.4 g of 9,10-diethoxyanthracene-2-sodium sulfonate in a solvent mixture of 200 ml of water and 200 ml of methanol were mixed and stirred at room temperature for 6 hours. Methanol was eliminated under reduced pressure and the precipitated yellow solid substance was filtered, washed with water, and dried to obtain Compound (I-a-32). The yield was 31.1 g.

Synthesis of Compound (I-a-31)

A solution obtained by dissolving 10.2 g of diphenyl iodonium chloride in a solvent mixture of 100 ml of water and 100 ml of methanol, and a solution obtained by dissolving 10.6 g of anthraquinone-2-sodium sulfonate hydrate in a solvent mixture of 200 ml of water and 200 ml of methanol were mixed and stirred at room temperature for 6 hours. Methanol was eliminated under reduced pressure and the precipitated yellow solid substance was filtered, washed with water, and dried to obtain Compound (I-a-31). The yield was 6 g.

Synthesis of Compound (II-a-32)

7.2 g of a 45% aqueous solution of triphenyl sulfonium chloride (manufactured by Fluka Corp.) and a solution obtained by dissolving 4.0 g of 9,10-diethoxyanthracene-2-sodium sulfonate in a solvent mixture of 100 ml of water and 100 ml of methanol were mixed and stirred at room temperature for 10 hours. Methanol was eliminated under reduced pressure and the precipitated yellow oil-like substance was separated, washed with water, and dried under reduced pressure to obtain Compound (II-a-32). The yield was 5.4 g.

Synthesis of Compound (II-a-23)

12.5 g of 2-hydroxy-4-methoxy benzophenone-5-sulfonic acid was dissolved in 100 ml of water. 1.4 g of sodium hydroxide dissolved in 30 ml of water and the resultant solution was added thereto. Then, 24 g of a 45% aqueous solution of triphenyl sulfonium chloride (manufactured by Fluka Corp.) was further added and stirred at room temperature for 10 hours. The precipitated yellow oil-like substance was separated, washed with water and dried under reduced pressure to obtain Compound (II-a-23). The yield was 18 g.

Synthesis of Compound (III-k-20)

3.4 g of acidic sulfate of 4-anilinobenzene diazonium was dissolved in 150 ml of water and mixed with a solution obtained by dissolving 4.1 g of dodecylbenzene sodium sulfonate in 100 ml of water followed by stirring at room temperature for 10 hours. The precipitated yellow oil-like substance was separated, washed with water, and dried under reduced pressure to obtain Compound (III-k-20). The yield was 25 g.

Diphenyl iodonium trifluolo methane sulfonate D2253 manufactured by Tokyo Kasei Kogyo Corp. was used as Compound (I-a-8), and TPS-105 (trademark) manufactured by Midori Kagaku Corp. was used as Compound (II-a-8).

(B) Synthesis of Cross-linking Agents

Synthesis of Cross-linking Agent [HM-1]

20 g of 1-[α-methyl-α-(4-hydroxy phenyl)ethyl]-4-[α,α-bis(4-hydroxyphenyl)ethyl]benzene (Trisp-PA manufactured by Honshu Chemical Industry Corp.) was added to a 10% aqueous solution of potassium hydroxide, then stirred and dissolved. Then, while the resultant solution was stirred, 60 ml of a 37% aqueous solution of formalin was gradually added to the solution over 1 hour at room temperature. After further stirring for 6 hours at room temperature, the solution was added to diluted sulfuric acid. The precipitated product was filtered, and washed sufficiently with water. By recrystallization with 30 ml of methanol, 20 g of white powder of a phenol derivative having hydroxy methyl group [HM-1] having the structure below was obtained. The purity thereof was 92% (liquid chromatography).

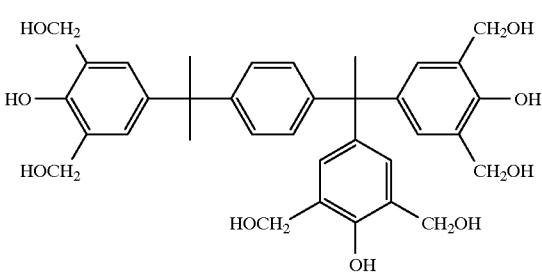

Synthesis of Cross-linking Agent [MM-1]

20 g of the phenol derivative having hydroxy methyl group [HM-1] obtained by the above-mentioned synthesis was added to 1 liter of methanol, then stirred and dissolved. 1 ml of concentrated sulfuric acid was added to the solution and 12-hour heating reflux was conducted. After completion of the reaction, the reacted solution was cooled and 2 g of potassium carbonate was added thereto. After sufficiently concentrating the mixture, 300 ml of ethyl acetate was added thereto. After washing the resultant solution with water, the solution was boiled down to obtain 22 g of white powder of a phenol derivative having a methoxy methyl group [MM-1] having the structure below. The purity thereof was 90% (liquid chromatography).

(MM-1)

Furthermore, in the same processes, phenol derivatives having the following structures were synthesized:

(HM-2)

(MM-2)
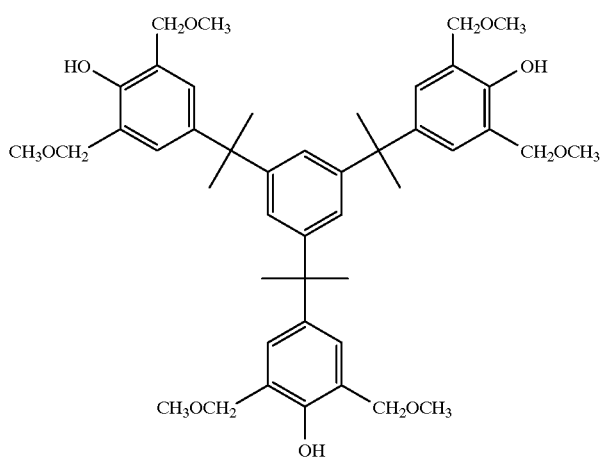
(HM-3)
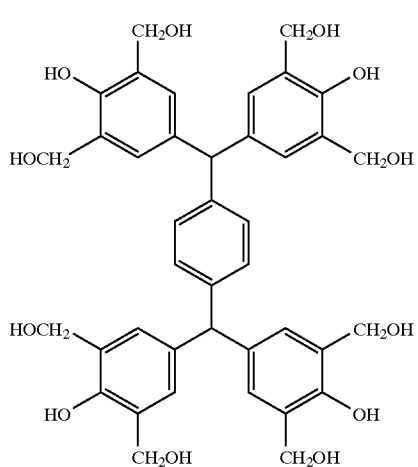
(MM-3)
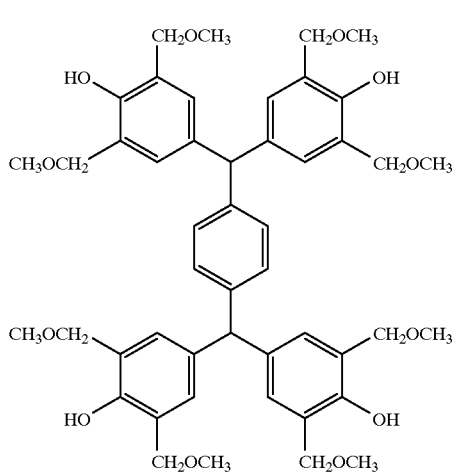
(HM-4)
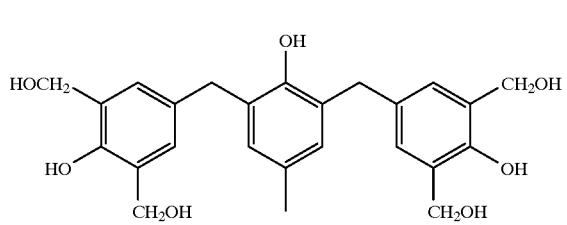

(MM-4)

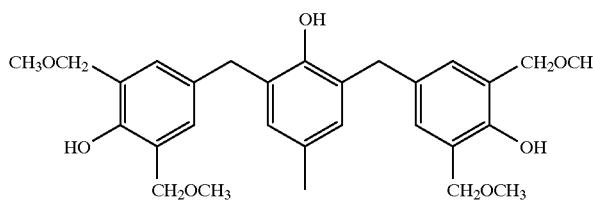

(MM-5)

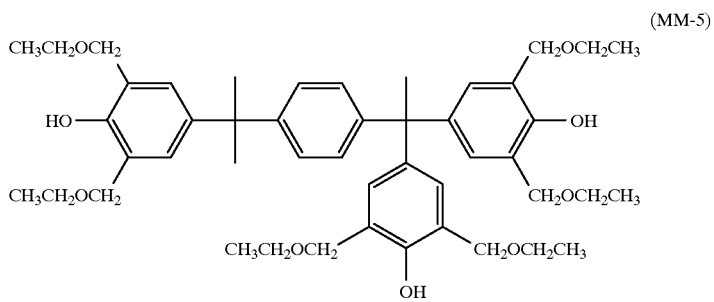

Examples 1 to 6

An aluminum plate (material 1050) having a thickness of 0.30 mm was degreased by washing with trichloroethylene. A roughening treatment was applied to the aluminum plate by graining the surface with anylon brush and a suspension in which a 400-mesh powder of pumice stone is suspended in water, then washed thoroughly with water. The plate was etched by being immersed in a 25% aqueous solution of sodium hydroxide of 45° C. for 9 seconds and washed with water. The plate was further immersed in a 2% $HNO_3$ for 20 seconds and washed with water. The etching amount of the grained surface was about 3 $g/m^2$. Then, the plate was provided with a direct current anodic oxidization film of 3 $g/m^2$ with 7% $H_2SO_4$ as the electrolyte and a current density of 15 $A/dm^2$, washed with water, and dried. The primer solution below was applied to the aluminum plate, which was then dried at 80° C. for 30 seconds. The amount of dried coating was 10 $mg/m^2$.

| Primer Solution | |
|---|---|
| β-alanine | 0.1 g |
| Phenyl sulfonic acid | 0.05 g |
| Methanol | 40 g |
| Pure water | 60 g |

In solution [A] below, with different types of compounds represented by the general formulas, 6 types of solution, [A-1] to [A-6], were prepared. Solutions were applied to the above-mentioned aluminum plates on which a primer layer was formed and dried at 100° C. for 1 minute to obtain negative type planographic plates [A-1] to [A-6]. The weight of dried coating was 1.9 $g/m^2$.

Solution [A]

| | |
|---|---|
| Compound represented by general formulas (I) to (III) | 0.15 g |
| Infrared ray absorbing agent NK-2014 (manufactured by Nippon Kankoshikiso Kenkyujo, Co., Ltd.) | 0.10 g |
| Novolak resin obtained from phenol and formaldehyde (Mw 10,000) | 1.5 g |
| cross-linking agent [MM-1] | 0.50 g |
| Fluorine-containing surfactant "Megafak F-177 (trademark)" (manufactured by Dainippon Ink & Chemicals, Inc.) | 0.03 g |
| Methyl ethyl ketone | 20 g |
| 1-methoxy-2-propanol | 7 g |
| Methyl alcohol | 3 g |

Compounds used in solutions [A-1] to [A-6] are shown in Table 1.

TABLE 1

| Example | Planographic printing plate | Compound |
|---|---|---|
| 1 | [A-1] | (I-a-8) |
| 2 | [A-2] | (I-a-31) |
| 3 | [A-3] | (I-a-32) |
| 4 | [A-4] | (II-a-8) |
| 5 | [A-5] | (II-a-23) |
| 6 | [A-6] | (II-a-32) |

Obtained negative type planographic plates [A-1] to [A-6] were stored under high-temperature and high-humidity conditions of 35° C. and 75% for 5 days, and exposed to infrared rays having a wavelength of 830 nm emitted from a semiconductor laser. After exposure, heat treatment was applied to plates in an oven at 120° C. for 2 minutes, and then the plates were developed in an automatic developing machine with developer DP-4 (1:8) and rinsing solution FR-3 (1:7) which were manufactured by Fuji Photo Film Co., Ltd. Plate surfaces were treated with gum GU-7 (1:1) manufactured by Fuji Photo Film Co., Ltd., followed by printing with a Heidel KOR-D machine. After printing, a nonimage portion of a print was observed to examine whether stains were formed on the nonimage portion. Results are shown Table 2. In all cases, preferable prints without stains in the nonimage portion were obtained.

Comparative Examples 1 and 2

The negative type planographic plates [B-1] and [B-2] were produced in the same manner as in Examples 1 to 6 except that diphenyl iodonium hexafluorophosphate (disclosed in an Example of Japanese Patent Application Laid-Open (JP-A) No. 7-20629) or diphenyl iodonium chloride was used in place of the compounds represented by the general formulas (I) to (III) in solution [A] used in Examples 1 to 6. The obtained negative type planographic plates [B-1] to [B-2] were stored under high-temperature and high-humidity conditions of 35° C. and 75% for 5 days followed by image formation and printing as in Examples 1 to 6. After printing, a nonimage portion of a print was observed to examine whether stains were formed on the nonimage portion. Results are shown in Table 2. In Comparative Example [B-1], stains were formed in the nonimage portion, and in [B-2], a negative image was not formed.

In a case in which storage under high-temperature and high-humidity conditions was not effected, stains in the nonimage portion at the time of printing were not found in planographic printing plate [B-1], but a negative image was not formed in [B-2].

TABLE 2

|  | Planographic printing plate | Stains in nonimage portion at printing |
| --- | --- | --- |
| Ex. 1 | [A-1] | None |
| Ex. 2 | [A-2] | None |
| Ex. 3 | [A-3] | None |
| Ex. 4 | [A-4] | None |
| Ex. 5 | [A-5] | None |
| Ex. 6 | [A-6] | None |
| Comp. Ex. 1 | [B-1] | Found |
| Comp. Ex. 2 | [B-2] | No negative image formation |

From the results from Examples 1 to 6 and Comparative Examples 1 and 2, negative type planographic plates of the present invention have excellent storability under high-temperature and high-humidity conditions.

Examples 7 to 12

Negative type planographic plates [A-1] to [A-6] obtained in Examples 1 to 6 were exposed to infrared rays having a wavelength of 830 nm emitted from a semiconductor laser. After exposure, heat treatment was applied to plates in an oven at 120° C. for 2 minutes and then the plates were developed in an automatic developing machine with developer DP-4 (1:8) and rinsing solution FR-3 (1:7) which were manufactured by Fuji Photo Film Co., Ltd. Plate surfaces were treated with gum GU-7 (1:1) manufactured by Fuji Photo Film Co., Ltd., followed by printing with a Heidel KOR-D machine. At the time, the number of obtained prints was checked. Results are shown in Table 3. In all cases, more than 30,000 sheets of preferable prints were obtained.

Comparative Example 3

Negative type planographic printing plate [C-1] was produced in the same manner as in Examples 1 to 6 except that 2,6-bis(trichloromethyl)-4-(1-naphthyl)-s-triazine (T-2 disclosed in an Example of Japanese Patent Application Laid-Open (JP-A) No. 7-271029) was used in place of the compounds represented by general formulas (I) to (III) in solution [A] used in Examples 1 to 6. The obtained negative type planographic printing plate C-1 was exposed by a laser, heat-treated at 120° C. for 2 minutes, developed, rinsed, and treated with a gum, followed by printing with a Heidel KOR-D machine as in Examples 7 to 12. At the time, the number of obtained prints was checked. Results are shown in Table 3. Only 13,000 sheets of preferable prints were obtained.

TABLE 3

|  | Planographic printing plate | Number of prints |
| --- | --- | --- |
| Ex. 7 | [A-1] | 33,000 |
| EX. 8 | [A-2] | 30,000 |
| Ex. 9 | [A-3] | 32,000 |
| Ex. 10 | [A-4] | 30,000 |
| Ex. 11 | [A-5] | 35,000 |
| Ex. 12 | [A-6] | 34,000 |
| Comp. Ex. 3 | [C] | 13,000 |

From the results of Examples 7 to 12 and Comparative Example 3, it was found that planographic plates using a negative type image recording material of the present invention have excellent plate wear upon printing.

Examples 13 to 16

In solution [D] below, with different types of compounds in the general formulas, 4 types of solution, [D-1] to [D-4], were prepared. Solutions were applied to the above-mentioned aluminum plates on which a primer layer was formed in Examples 1 to 6, respectively, and dried at 100° C. for 2 minutes to obtain negative type planographic plates [D-1] to [D-4]. The weight of dried coating was 1.8 g/m². The compounds used in solutions [D-1] to [D-4] are shown in Table 4.

Solution [D]

| Compound represented by general formulas (I) to (III) | 0.15 g |
| --- | --- |
| Infrared ray absorbing agent NK-2014 (manufactured by Nippon Kankoshikiso Kenkyujo, Co., Ltd.) | 0.10 g |
| Novolak resin obtained from cresol and formaldehyde (meta:para ratio = 8:2, Mw 5800) | 1.1 g |
| Resol resin obtained from bisphenol A and formaldehyde (Mw 1600) | 1.0 g |
| Fluorine-containing surfactant Megafak F-177 (manufactured by Dainippon Ink & Chemicals, Inc.) | 0.06 g |
| Methyl ethyl ketone | 20 g |
| 1-methoxy-2-propanol | 7 g |

Obtained negative type planographic plates [D-1] to [D-4] were exposed to infrared rays having a wavelength of 830 nm emitted from a semiconductor laser. After exposure, heat treatment was applied to plates at 120° C. for 2 minutes and then the plates were treated in an automatic developing machine with developer DP-4 (1:8) and rinsing solution FR-3 (1:7) which were manufactured by Fuji Photo Film Co., Ltd. Plate surfaces were treated with gum GU-7 (1:1) manufactured by Fuji Photo Film Co., Ltd., followed by printing with a Heidel KOR-D machine. At the time, the number of obtained prints was checked. Results are shown in Table 4. In all cases, 40,000 or more sheets of preferable prints were obtained.

Comparative Example 4

Negative type planographic printing plate [E] was produced in the same manner as in Examples 13 to 16 except that 2,6-bis(trichloromethyl)-4-(1-naphthyl)-s-triazine (T-2 disclosed in Examples of Japanese Patent Application Laid-Open (JP-A) No. 7-271029) was used in place of the compounds represented by general formulas (I) to (III) in solution [D] used in Examples 13 to 16. The obtained negative type planographic printing plate [E] was exposed by a laser, heat treated at 120° C. for 2 minutes, developed, rinsed, and treated with a gum, followed by printing with a Heidel KOR-D machine as in Examples 13 to 16. At the time, the number of obtained prints was checked. Results are shown in Table 4. Only 22,000 sheets of preferable prints were obtained.

TABLE 4

|  | Planographic plate | Compound | Number of prints |
|---|---|---|---|
| Ex. 13 | [D-1] | (I-a-8) | 41,000 |
| Ex. 14 | [D-2] | (I-a-32) | 41,000 |
| Ex. 15 | [D-3] | (II-a-23) | 42,000 |
| Ex. 16 | [D-4] | (III-k-20) | 40,000 |
| Comp. Ex. 4 | [E] |  | 22,000 |

From the results of Examples 13 to 16 and Comparative Example 4, it was found that planographic plates using a negative type image recording material of the present invention have excellent plate wear upon printing.

Examples 17 to 19

In solution [F] below, with different types of compounds in the general formulas, 3 types of solutions, [F-1] to [F-3], were prepared. Solutions were applied to the abovementioned aluminum plates on which a primer layer was formed in [Examples 1 to 6], respectively, and dried at 100° C. for 2 minutes to obtain negative type planographic plates [F-1] to [F-3]. The weight of dried coating was 1.5 g/m².

Solution [F]

| Compound represented by the general formulas (I) to (III) | 0.15 g |
|---|---|
| Infrared ray absorbing agent NK-2014 (manufactured by Nippon Kankoshikiso Kenkyujo, Co., Ltd.) | 0.10 g |
| Allylmethacrylate-methacrylic acid copolymer (weight component ratio 83/17, Mw 53,000) | 1.5 g |
| Cross-linking agent [MM-1] | 0.50 g |
| Fluorine-containing surfactant Megafak F-177 (manufactured by Dainippon Ink & Chemicals, Inc.) | 0.03 g |
| Methyl ethyl ketone | 20 g |
| 1-methoxy-2-propanol | 7 g |
| Methyl alcohol | 3 g |

Obtained negative type planographic plates [F-1] to [F-3] were exposed to infrared rays having a wavelength of 830 nm emitted from a semiconductor laser. After exposure, heat treatment was applied to plates in an oven at 120° C. for 2 minutes and then the plates were developed in an automatic developing machine with developer DP-4 (1:8), and rinsing solution FR-3 (1:7) which were manufactured by Fuji Photo Film Co., Ltd. Plate surfaces were treated with gum GU-7 (1:1) manufactured by Fuji Photo Film Co., Ltd., followed by printing with a Heidel KOR-D machine. At the time, the number of the obtained prints was checked. Results are shown in Table 5. In all cases, 20,000 or more sheets of preferable prints were obtained. The structure of allylmethacrylate-methacrylic acid copolymer used in this example is shown below.

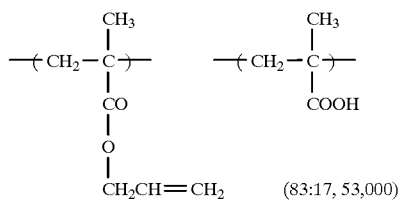

(83:17, 53,000)

Comparative Examples 5 and 6

Negative type planographic plates [G-1] and [G-2] were produced in the same manner as in Examples 17 to 19 except that diphenyl iodonium hexafluorophosphate (disclosed in an Example of Japanese Patent Application Laid-Open (JP-A) No. 7-20629) or diphenyl iodonium chloride was used in place of the compounds represented by general formulas (I) to (III) in solution [F] used in Examples 17 to 19. Obtained negative type planographic plates [G-1] and [G-2] were provided for image formation and printing with a Heidel KOR-D machine as in Examples 17 to 19. At the time, the number of obtained prints were checked. Results are shown in Table 5. Only 5,000 or fewer sheets of preferable prints were obtained.

TABLE 5

|  | Planographic printing plate | Compound | Number of prints |
|---|---|---|---|
| Ex. 17 | [F-1] | (I-a-8) | 25,000 |
| Ex. 18 | [F-2] | (I-a-32) | 21,000 |
| Ex. 19 | [F-3] | (II-a-23) | 20,000 |
| Comp. Ex. 5 | [G-1] |  | <5,000 |
| Comp. Ex. 6 | [G-2] |  | <5,000 |

From the results of Examples 17 to 19 and Comparative Examples 5 to 6, it was found that planographic plates using a negative type image recording material of the present invention have excellent plate wear upon printing.

Examples 20 to 22, Comparative Examples 7, 8

The negative type planographic plates [A-1] to [A-3] obtained in Examples 1 to 3 were stored under a high-temperature condition of 60° C. for 3 days, followed by image formation and printing as in Examples 1 to 6. Stains in the nonimage portion were not formed in the plates [A-1] to [A-3] where a phenol derivative having an alkoxymethyl group, [MM-1], of the present invention was used.

Results are shown in Table 6.

TABLE 6

|  | Planographic plate | Stains in nonimage portion at printing |
|---|---|---|
| Ex. 20 | [A-1] | None |
| Ex. 21 | [A-2] | None |
| Ex. 22 | [A-3] | None |

What is claimed is:
1. A negative type image recording material comprising (A) an onium salt compound having sulfonic acid as the counter ion and selected from the group consisting of diazonium sulfonate represented by the following structural formula (III), (B) a cross-linking agent cross-linkable by an acid, (C) a polymer compound having an alkaline-soluble group, and (D) an infrared ray absorbing agent:

$$Ar^1—N_2^+R^1—SO_3^- \quad (III)$$

wherein $R^1$ represents a hydrocarbon group having 20 or fewer carbon atoms which may be substituted; and $Ar^1$ represents an aryl group having 20 or fewer carbon atoms which may be substituted.

2. The negative type image recording material according to claim 1, wherein the cross-linking agent is a phenol derivative having, in a molecule, at least two hydroxymethyl or alkoxymethyl groups bonded to a benzene ring, and 3 to 5 benzene rings, and having a molecular weight of 1,200 or less.

3. The negative type image recording material according to claim 2, wherein the cross-linking agent is a phenol derivative having, in a molecule, at least two alkoxymethyl groups bonded to a benzene ring, 3 to 5 benzene rings, and having a molecular weight of 1,200 or less.

4. The negative type image recording material according to claim 1, wherein said cross-linking agent comprises a compound represented by the following structural formula and/or a resol resin:

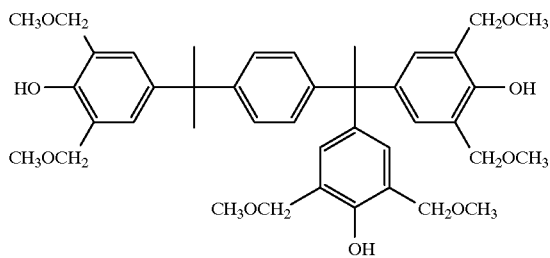

5. The negative type image recording material according to claim 1, wherein the amount of said onium salt compound having sulfonic acid as the counter ion is 0.01 to 50% by weight.

6. The negative type image recording material according to claim 1, wherein the amount of said cross-linking agent is 5 to 70% by weight.

7. The negative type image recording material according to claim 1, wherein the amount of said polymer compound having an alkaline-soluble group is 10 to 90% by weight.

8. The negative type image recording material according to claim 1, wherein the amount of said infrared ray absorbing agent is 0.01 to 50% by weight.

9. The negative type image recording material according to claim 1, wherein said onium salt compound having sulfonic acid as the counter ion has the following structural formula:

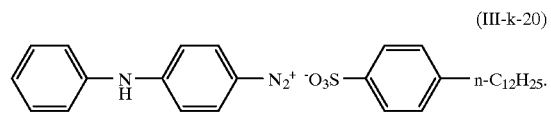

10. The negative type image recording material according to claim 9, wherein said cross-linking agent is a phenol derivative having, in a molecule, at least two hydroxymethyl or alkoxymethyl groups bonded to a benzene ring, and 3 to 5 benzene rings, and having a molecular weight of 1,200 or less.

11. The negative type image recording material according to claim 10, wherein said cross-linking agent is a phenol derivative having, in a molecule, at least two alkoxymethyl groups bonded to a benzene ring, and 3 to 5 benzene rings, and having a molecular weight of 1,200 or less.

12. The negative type image recording material according to claim 9, wherein said cross-linking agent comprises a compound represented by the following structure formula and a resol resin:

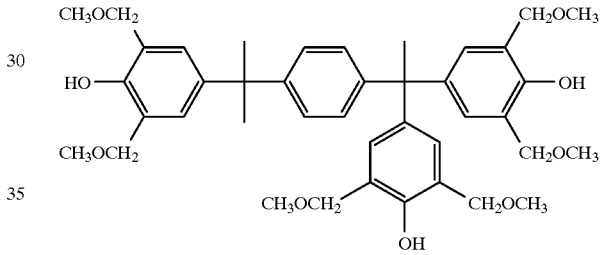

13. The negative type image recording material according to claim 12, wherein said polymer compound having an alkaline-soluble group is a novolak resin.

14. The negative type image recording material according to claim 13, further comprising an aluminum support.

* * * * *